(12) United States Patent
Lee et al.

(10) Patent No.: US 11,469,354 B2
(45) Date of Patent: Oct. 11, 2022

(54) SEMICONDUCTOR DEVICE AND HEAD LAMP COMPRISING SAME

(71) Applicant: SUZHOU LEKIN SEMICONDUCTOR CO., LTD., Taicang (CN)

(72) Inventors: Sang Youl Lee, Seoul (KR); Ki Man Kang, Seoul (KR); Do Yub Kim, Seoul (KR); Eun Dk Lee, Seoul (KR)

(73) Assignee: SUZHOU LEKIN SEMICONDUCTOR CO., LTD., Taicang (CN)

( * ) Notice: Subject to any disclaimer, the term of this patent is extended or adjusted under 35 U.S.C. 154(b) by 175 days.

(21) Appl. No.: 16/641,771

(22) PCT Filed: Aug. 31, 2018

(86) PCT No.: PCT/KR2018/010112
§ 371 (c)(1),
(2) Date: Feb. 25, 2020

(87) PCT Pub. No.: WO2019/045505
PCT Pub. Date: Mar. 7, 2019

(65) Prior Publication Data
US 2020/0251626 A1 Aug. 6, 2020

(30) Foreign Application Priority Data
Aug. 31, 2017 (KR) .................. 10-2017-0111229

(51) Int. Cl.
*H01L 33/50* (2010.01)
*F21S 41/153* (2018.01)
(Continued)

(52) U.S. Cl.
CPC .......... *H01L 33/505* (2013.01); *F21S 41/153* (2018.01); *F21S 41/192* (2018.01);
(Continued)

(58) Field of Classification Search
CPC . H01L 33/505; H01L 27/156; H01L 33/0093; H01L 33/382; H01L 33/44;
(Continued)

(56) References Cited

U.S. PATENT DOCUMENTS

2006/0284195 A1   12/2006  Nagai
2013/0193453 A1    8/2013  Donofrio et al.
(Continued)

FOREIGN PATENT DOCUMENTS

EP   1995 780      11/2008
JP   2005-079202    3/2005
(Continued)

OTHER PUBLICATIONS

European Search Report dated Jun. 4, 2020 issued in Application No. 18852573.7.
(Continued)

*Primary Examiner* — Su C Kim
(74) *Attorney, Agent, or Firm* — Birch, Stewart, Kolasch & Birch, LLP

(57) ABSTRACT

Disclosed in an embodiment are a semiconductor device and a head lamp comprising the same, the semiconductor device comprising: a substrate; a plurality of semiconductor structures arranged at a center part of the substrate; first and second pads arranged at an edge part of the substrate; a first wiring line electrically connecting at least one of the plurality of semiconductor structures to the first pad; a second wiring line electrically connecting at least one of the plurality of semiconductor structures to the second pad; and a wavelength conversion layer arranged on the plurality of semiconductor structures, wherein the plurality of semiconductor structures is arranged to be spaced apart from each other in a first direction and a second direction, the first direction and the second direction cross each other, the (Continued)

interval distance between the plurality of semiconductor structures is 5 µm to 40 µm and the thickness of the wavelength conversion layer is 1 µm to 50 µm.

16 Claims, 26 Drawing Sheets

(51) Int. Cl.
    *F21S 41/19*     (2018.01)
    *H01L 33/00*     (2010.01)
    *H01L 27/15*     (2006.01)
    *H01L 33/38*     (2010.01)
    *H01L 33/44*     (2010.01)
    *H01L 33/58*     (2010.01)
    *H01L 33/62*     (2010.01)
    *H01L 33/06*     (2010.01)
    *H01L 33/30*     (2010.01)

(52) U.S. Cl.
    CPC ........ *H01L 27/156* (2013.01); *H01L 33/0093* (2020.05); *H01L 33/382* (2013.01); *H01L 33/44* (2013.01); *H01L 33/58* (2013.01); *H01L 33/62* (2013.01); *H01L 33/06* (2013.01); *H01L 33/30* (2013.01); *H01L 2933/0016* (2013.01); *H01L 2933/0025* (2013.01); *H01L 2933/0041* (2013.01)

(58) Field of Classification Search
    CPC ......... H01L 33/58; H01L 33/62; H01L 33/06; H01L 33/30; H01L 2933/0016; H01L 2933/0025; H01L 2933/0041; H01L 25/075; H01L 33/36; F21S 41/153; F21S 41/192

See application file for complete search history.

(56) References Cited

U.S. PATENT DOCUMENTS

| | | | |
|---|---|---|---|
| 2014/0110730 A1* | 4/2014 | Lee | H01L 33/48 257/88 |
| 2014/0217433 A1 | 8/2014 | Tudorica et al. | |
| 2014/0306247 A1* | 10/2014 | Lee | H01L 33/60 257/88 |
| 2015/0008466 A1* | 1/2015 | Bierhuizen | H01L 27/156 257/98 |
| 2015/0262978 A1 | 9/2015 | Shibata | |
| 2017/0238419 A1* | 8/2017 | Hemer | H01L 27/153 362/84 |

FOREIGN PATENT DOCUMENTS

| | | |
|---|---|---|
| JP | 2008-218674 | 9/2008 |
| JP | 2013-219398 | 10/2013 |
| JP | 2015-173222 | 10/2015 |
| JP | 2017-112295 | 6/2017 |
| WO | WO 2016/092805 A1 | 6/2016 |

OTHER PUBLICATIONS

International Search Report dated Dec. 4, 2018 issued in Application No. PCT/KR2018/010112.

* cited by examiner

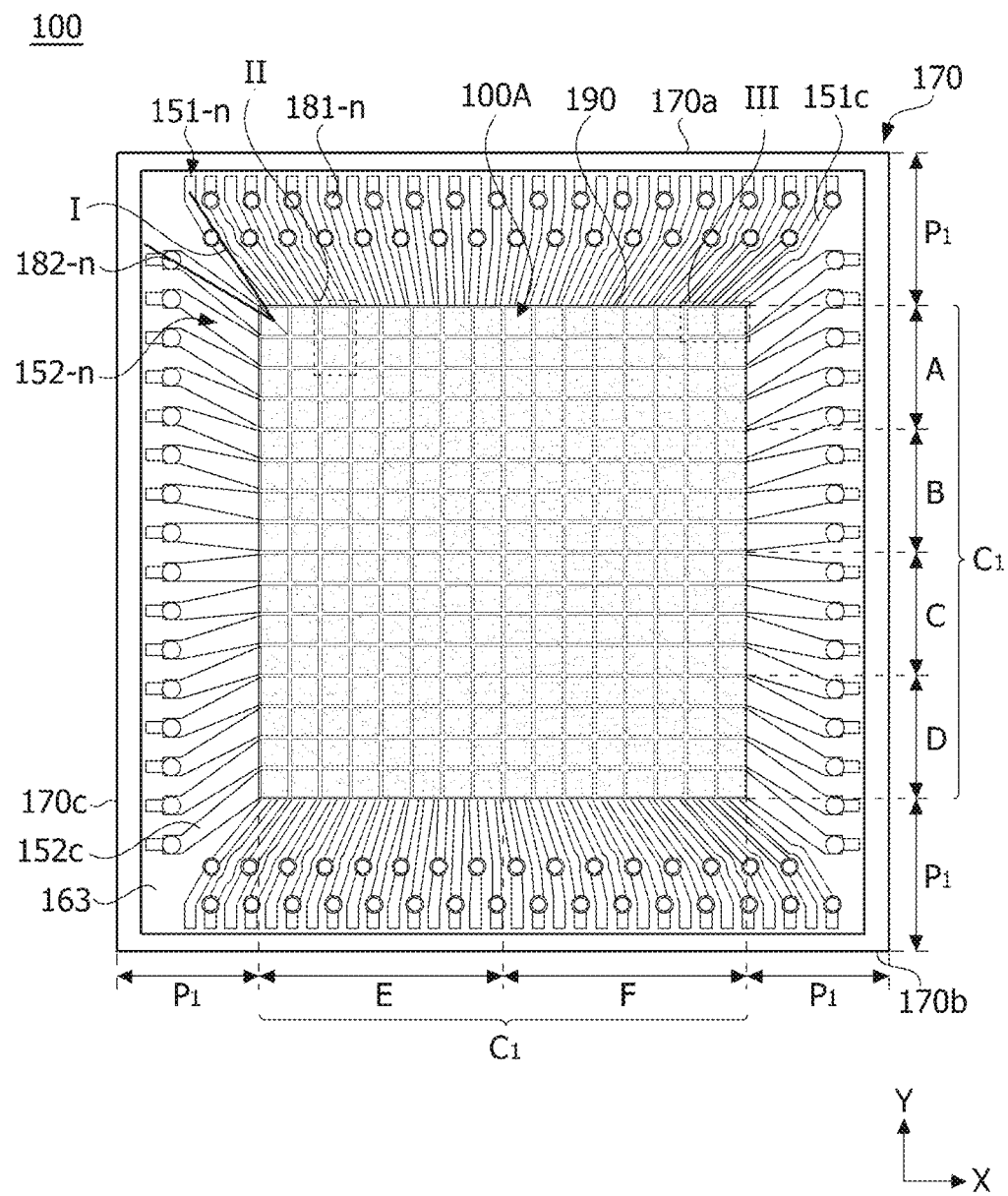
[FIG. 1]

[FIG. 2]
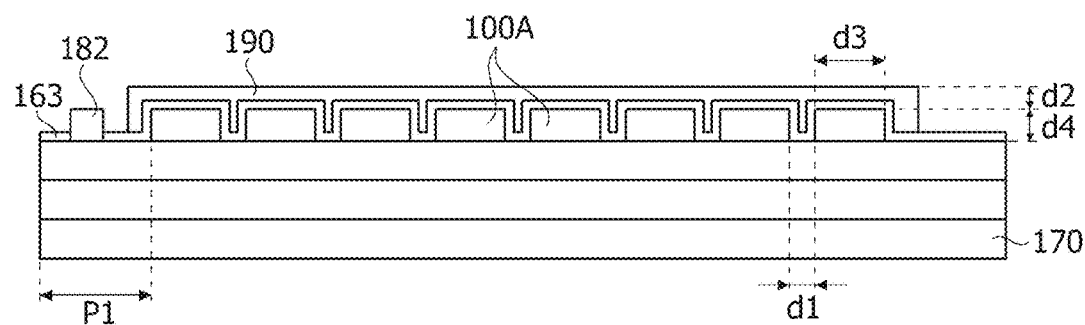

[FIG. 3]
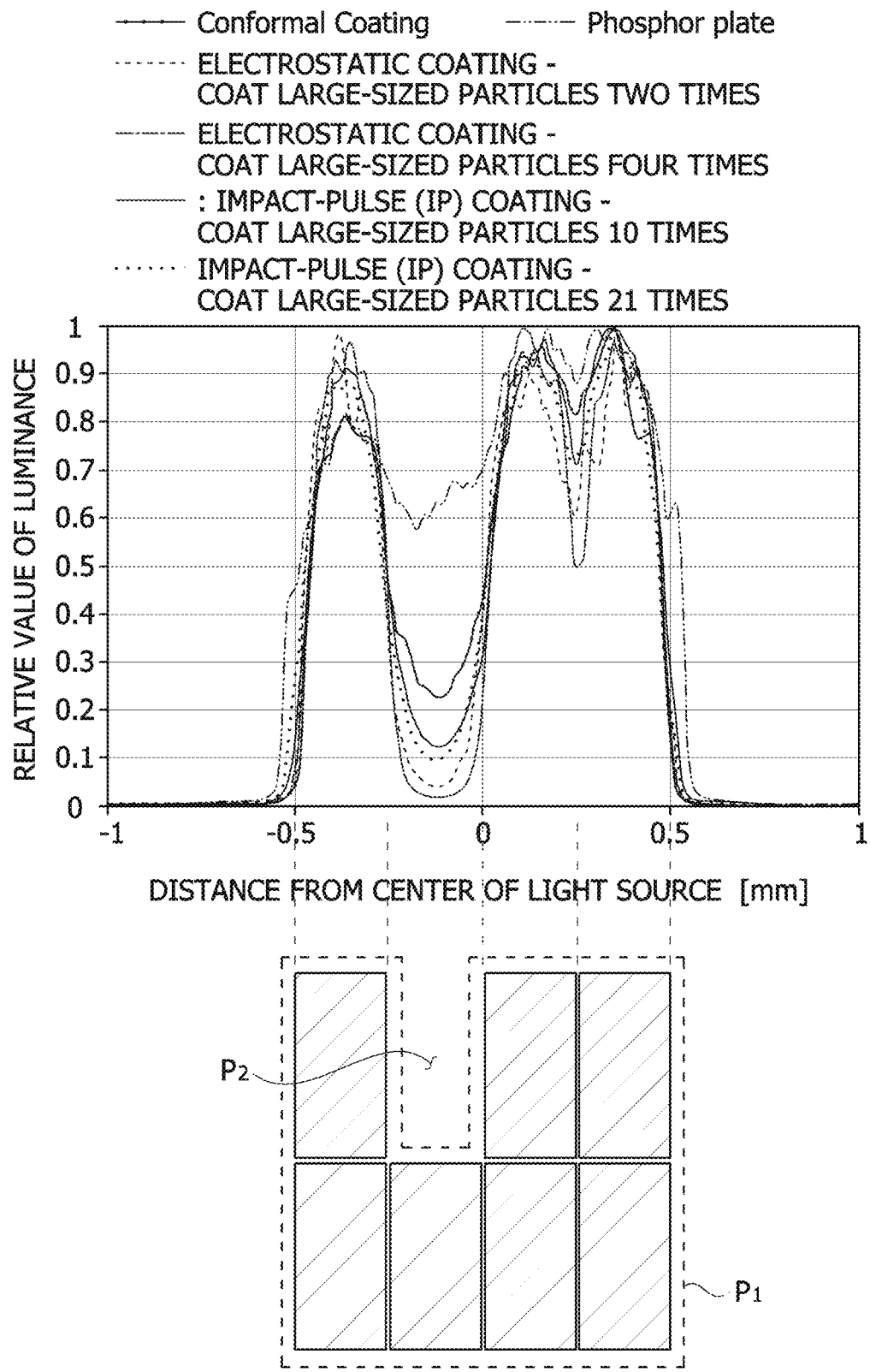

[FIG. 4A]
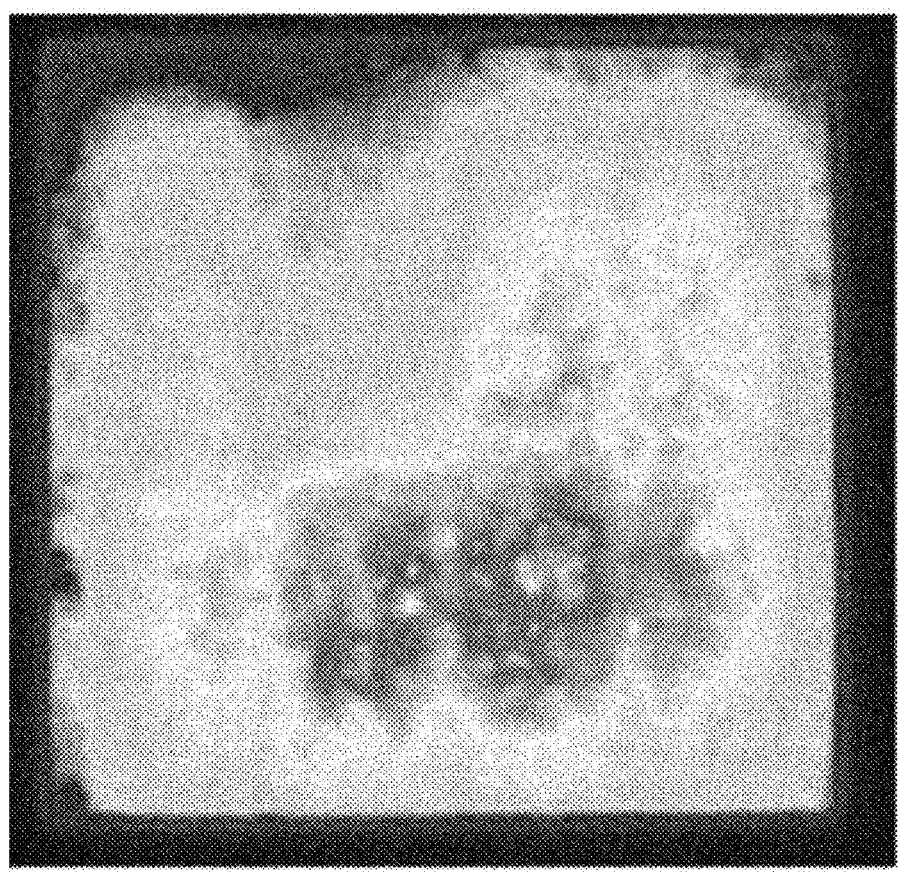

[FIG. 4B]
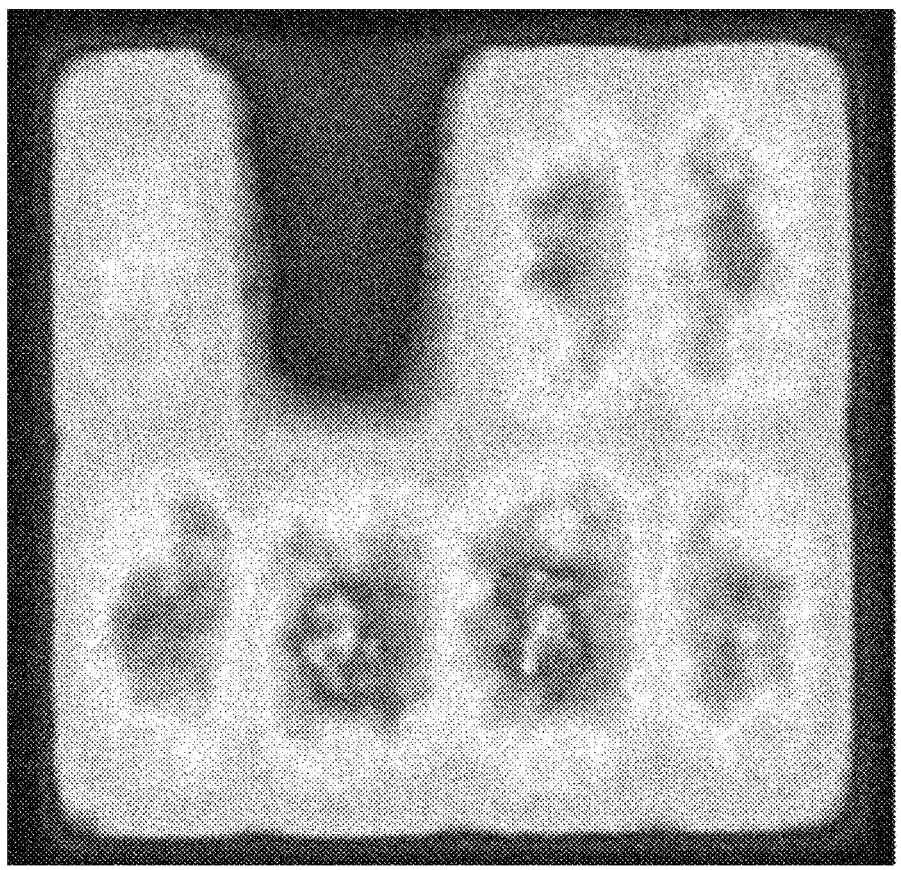

[FIG. 4C]
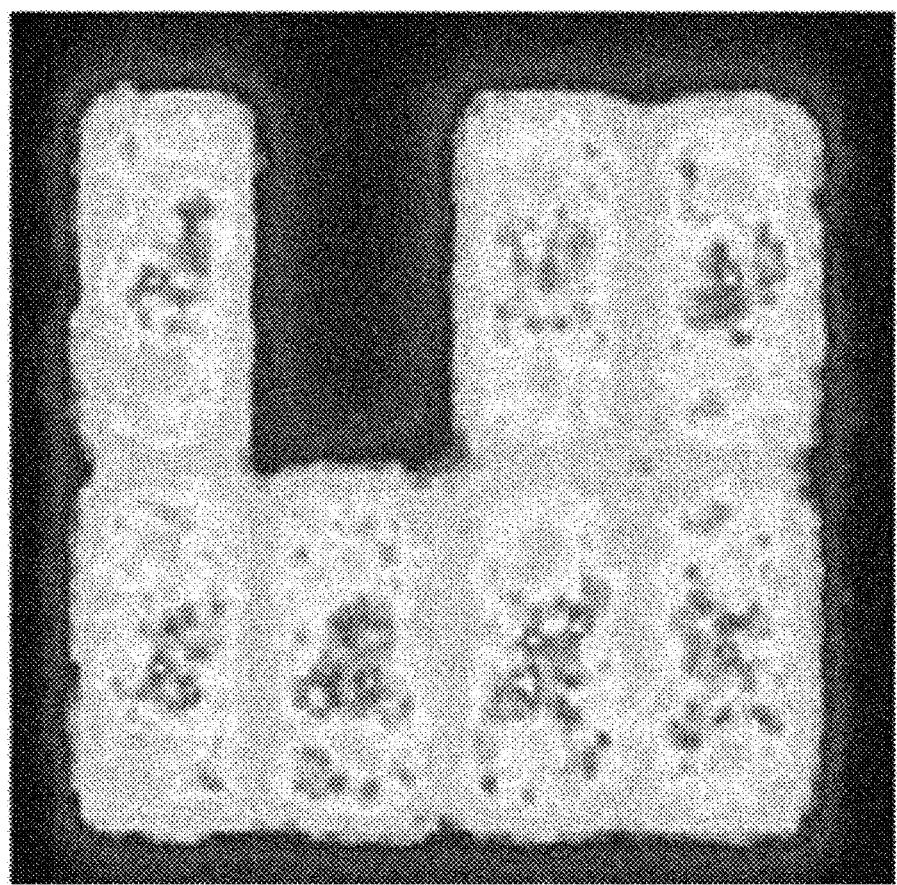

[FIG. 4D]
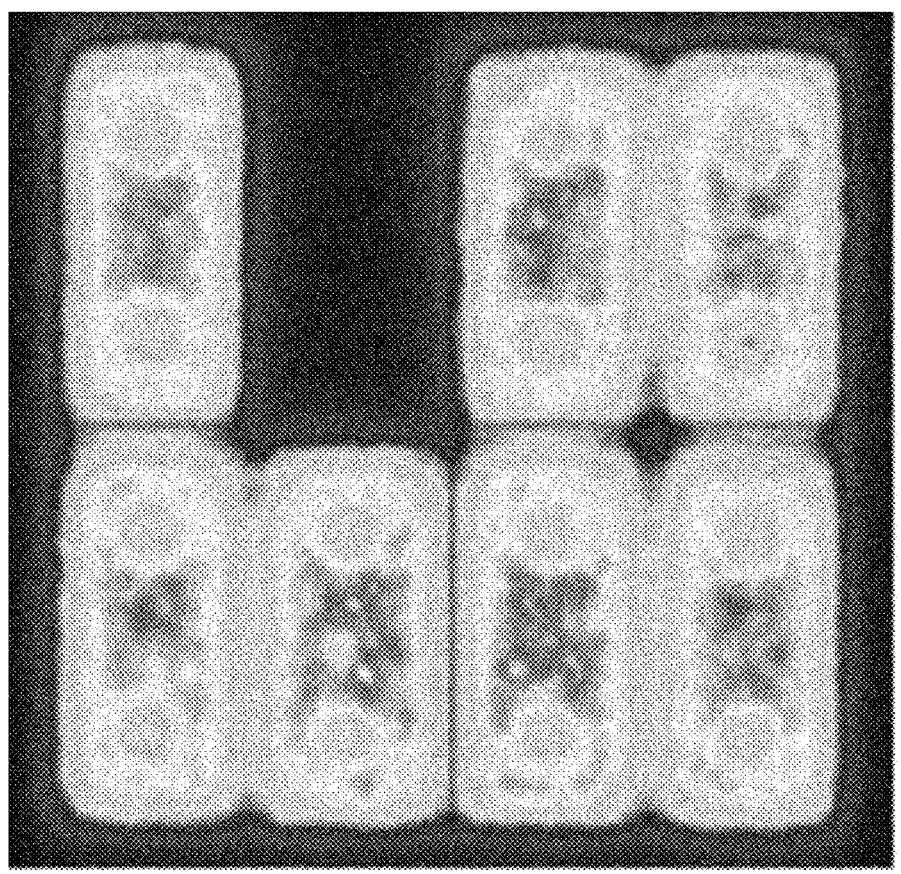

[FIG. 4E]
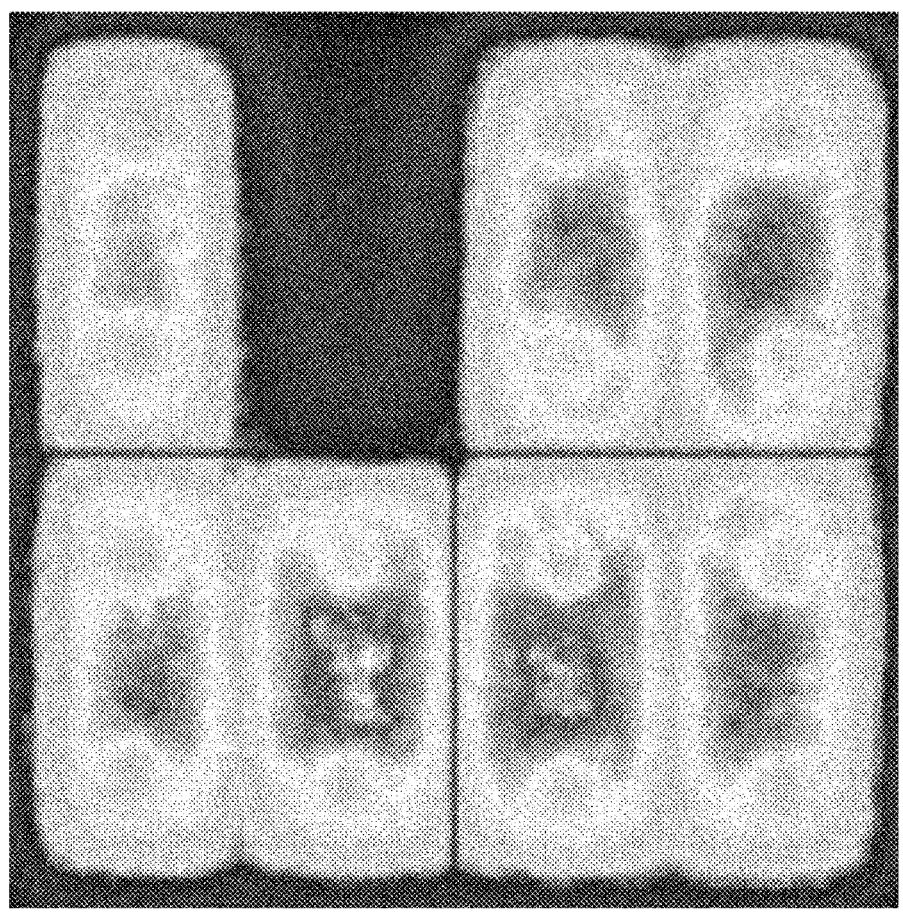

[FIG. 4F]
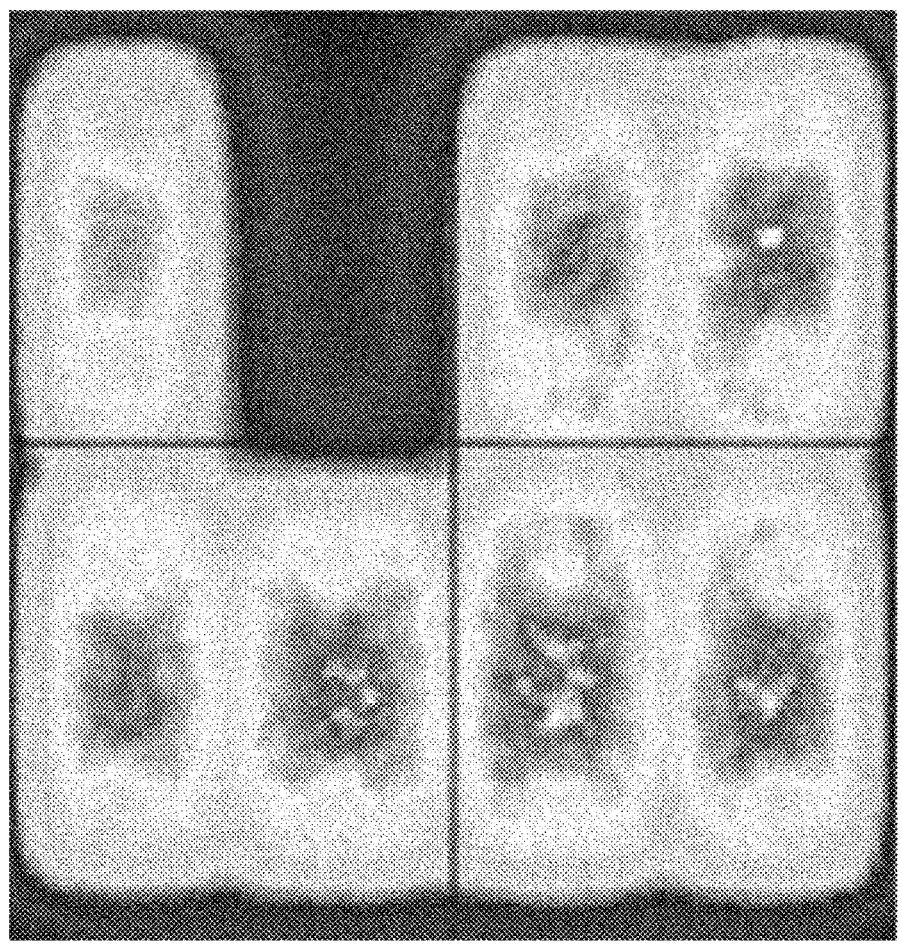

[FIG. 5]
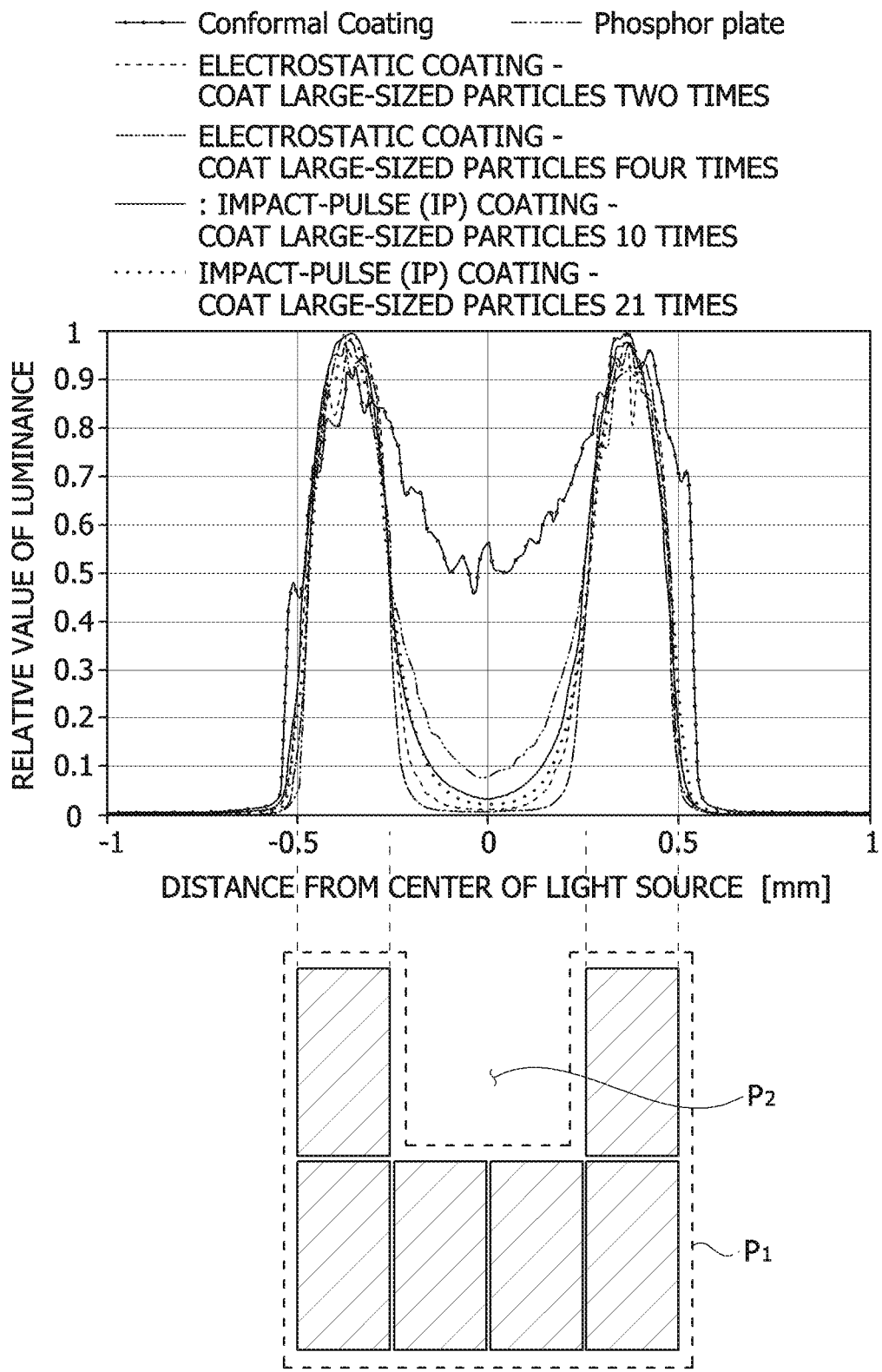

[FIG. 6A]
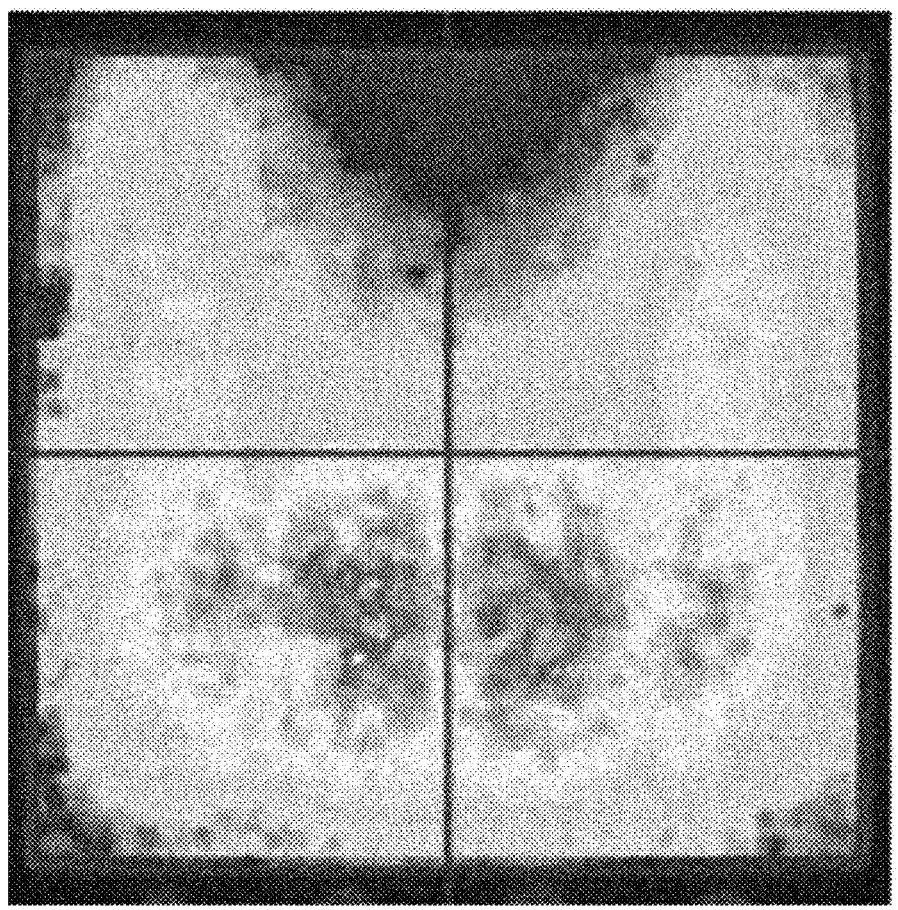

[FIG. 6B]
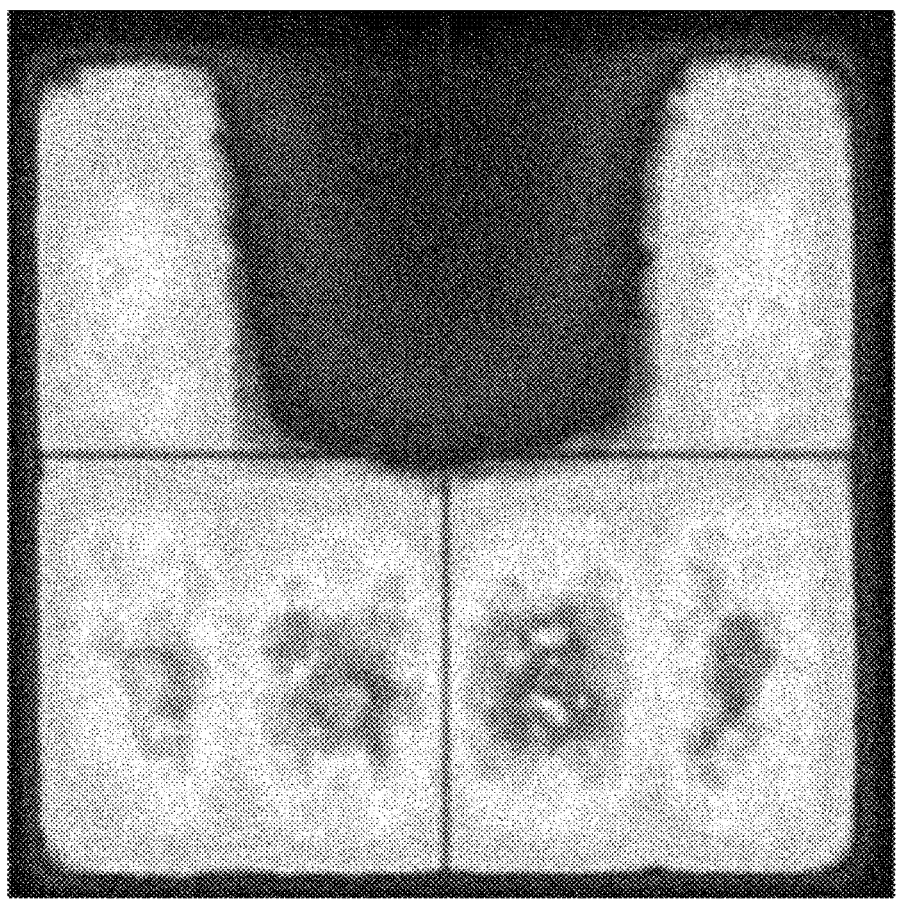

[FIG. 6C]
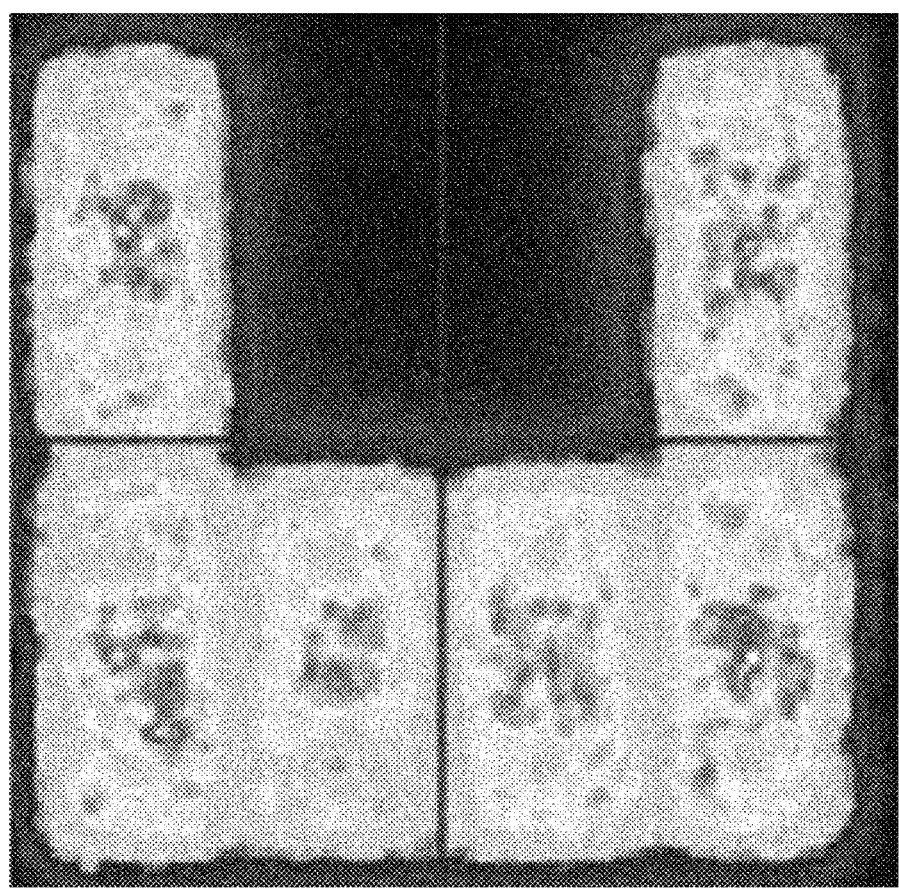

[FIG. 6D]
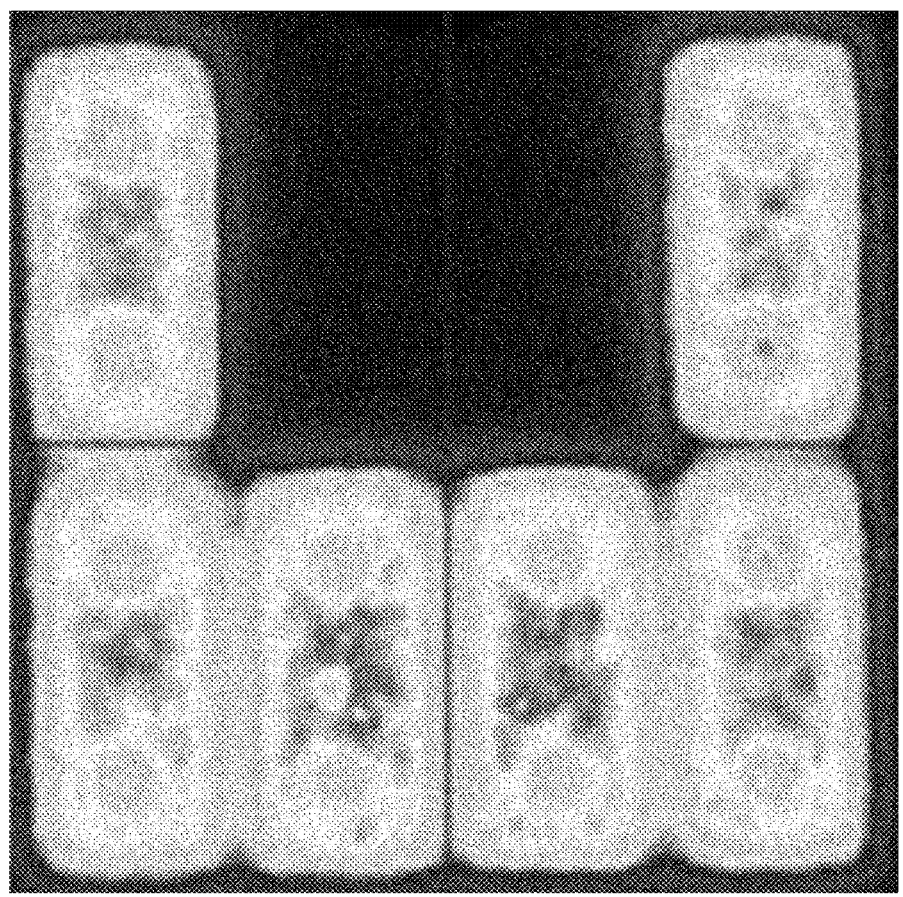

[FIG. 6E]
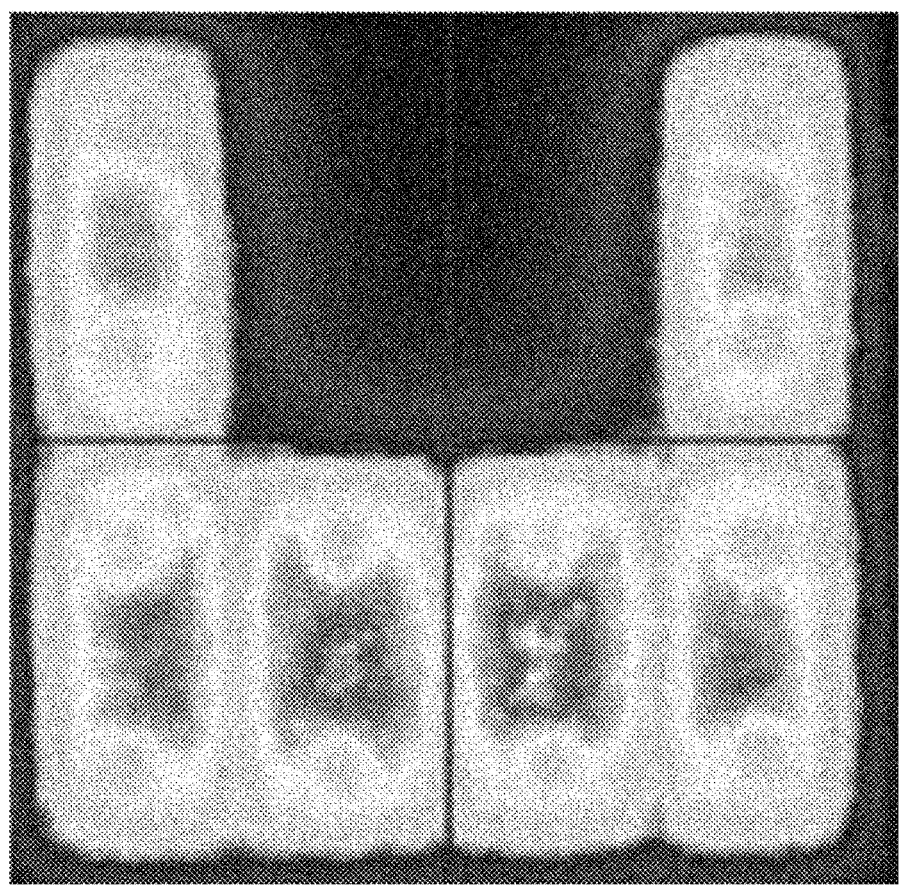

[FIG. 6F]
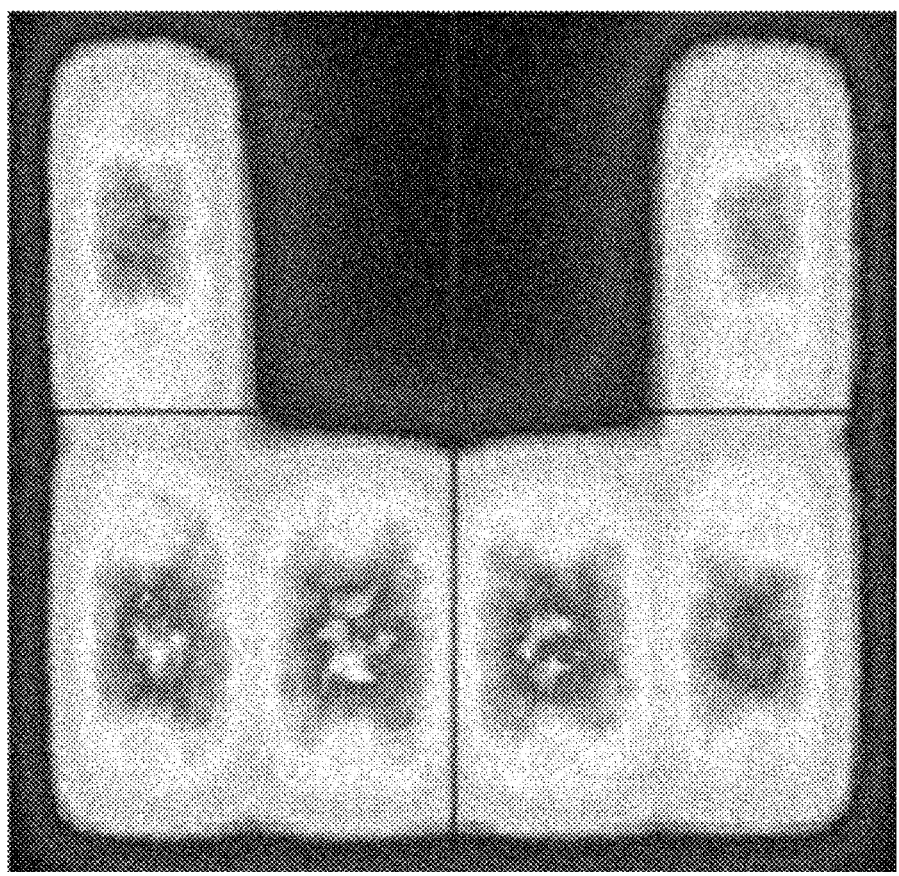

[FIG. 7]
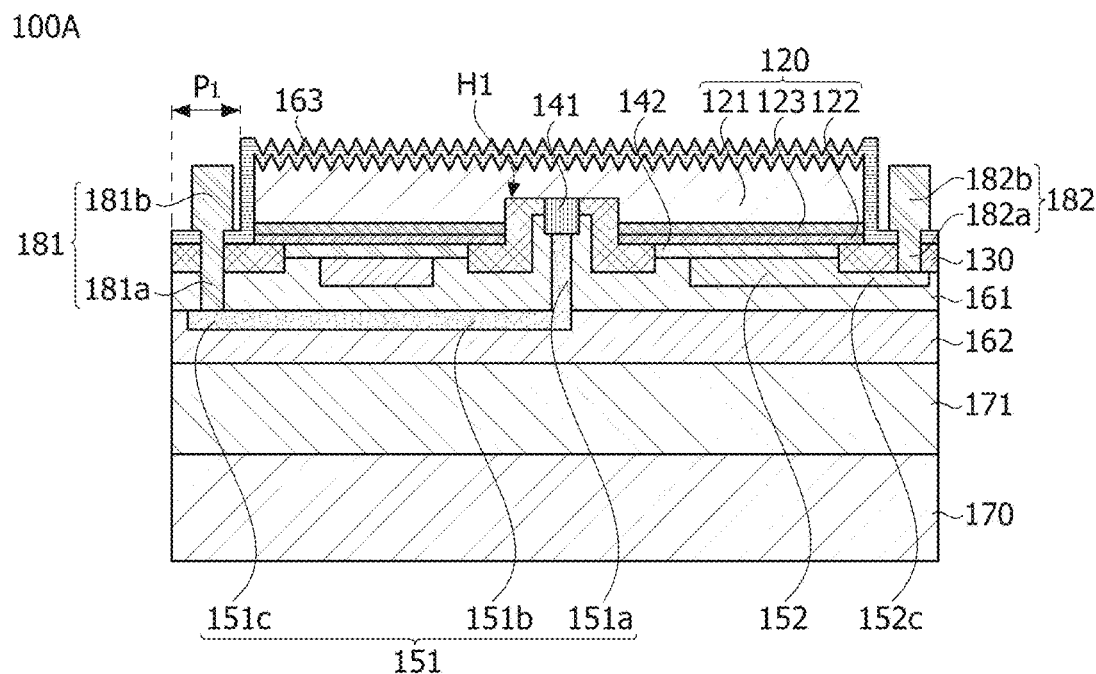
[FIG. 8A]
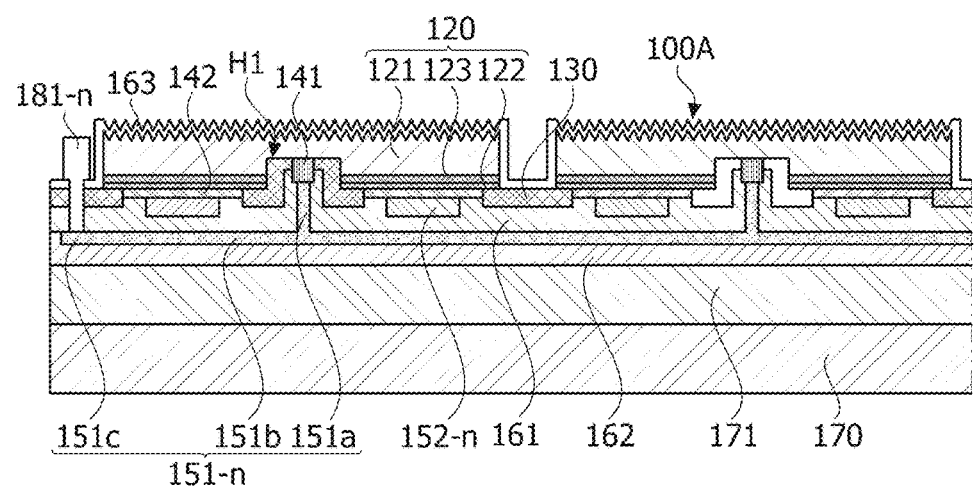

[FIG. 8B]
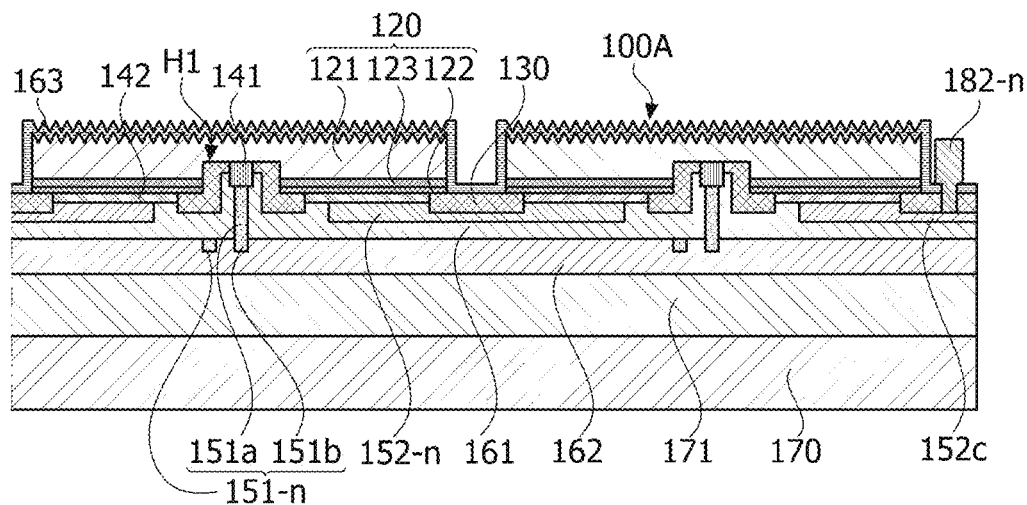
[FIG. 8C]
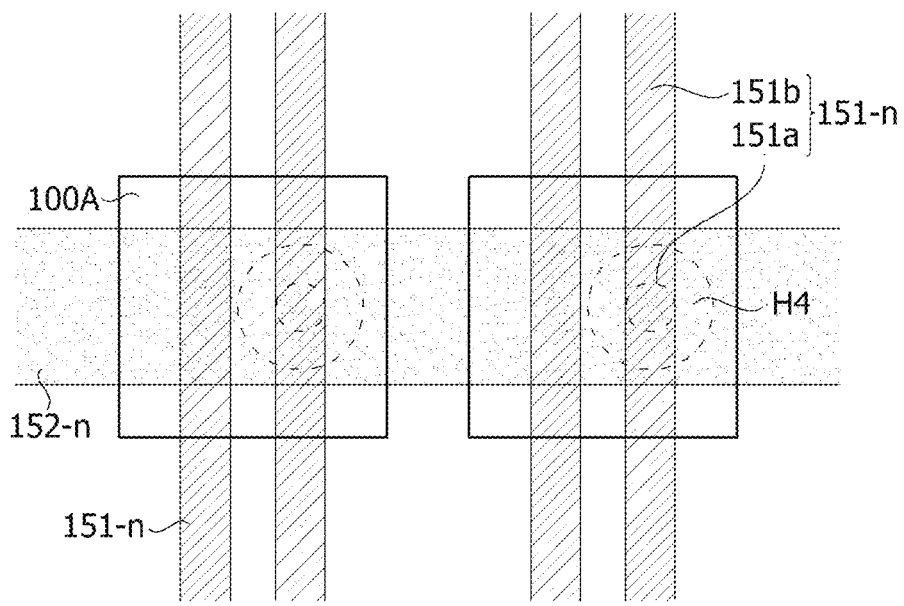

[FIG. 9A]
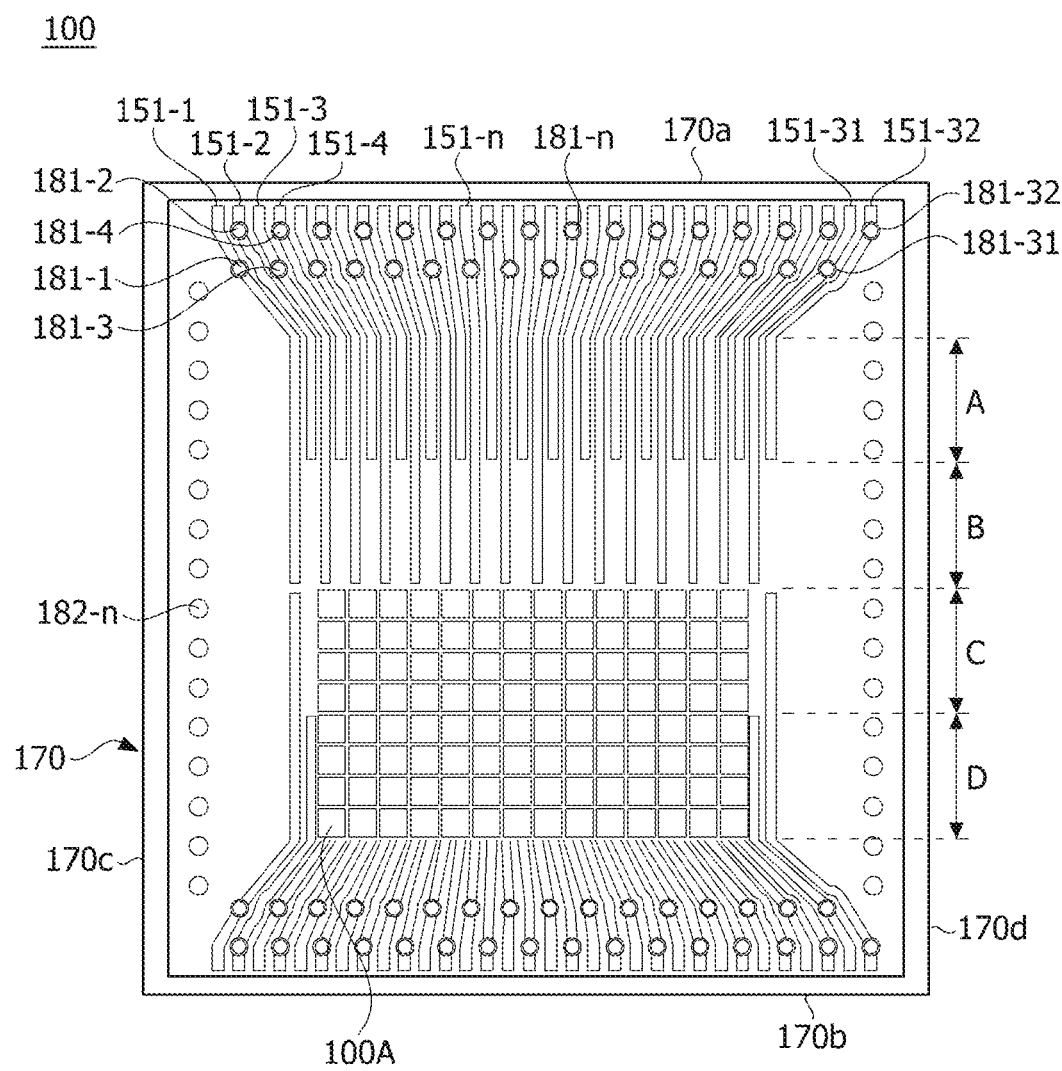

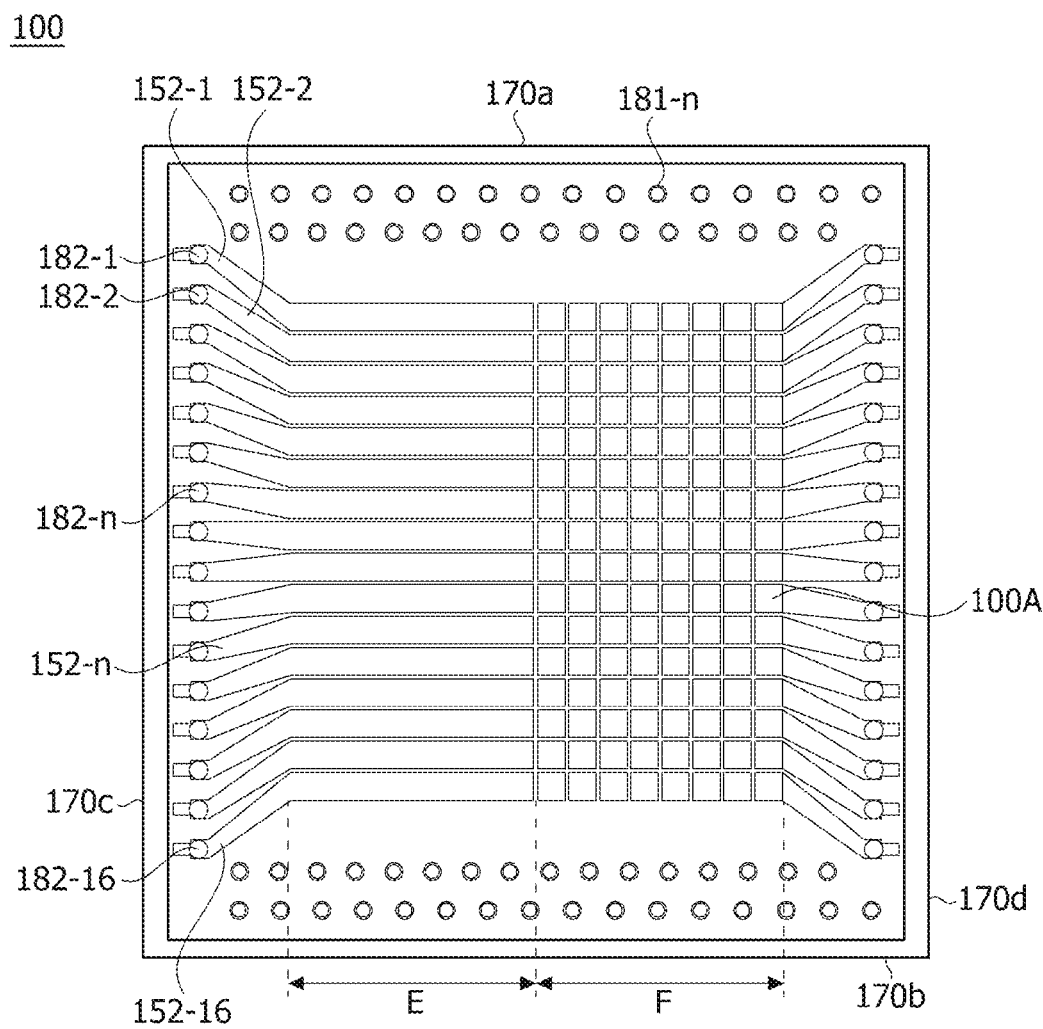
[FIG. 9B]

[FIG. 9C]
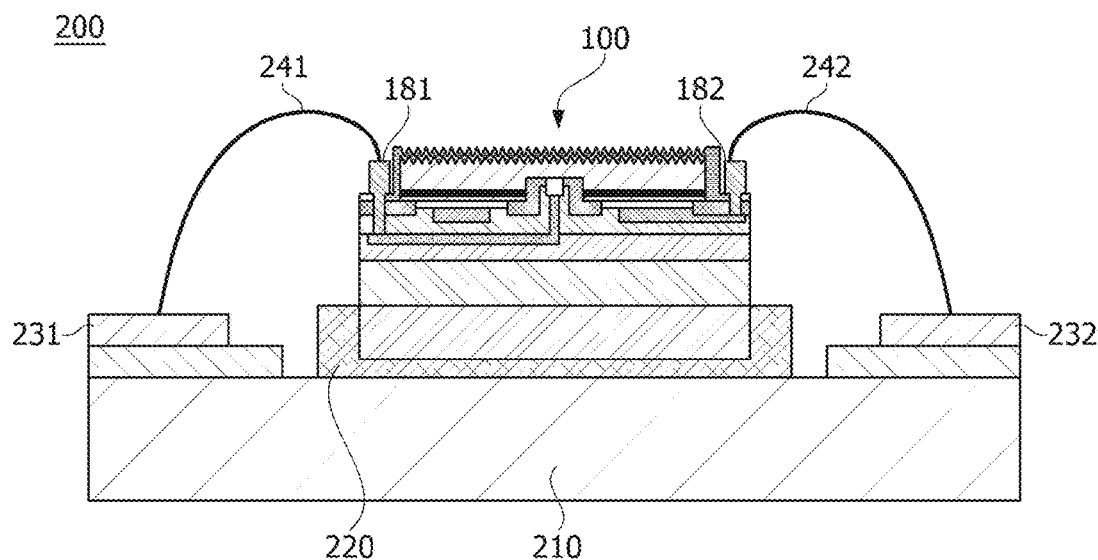
[FIG. 10A]
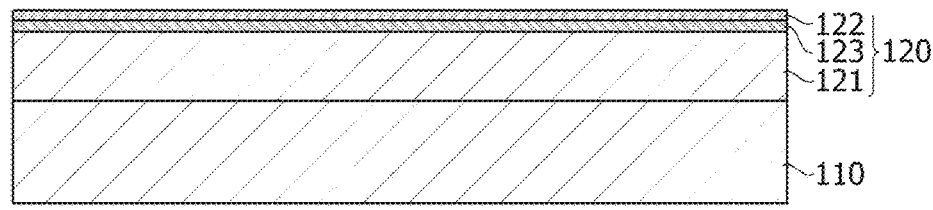
[FIG. 10B]
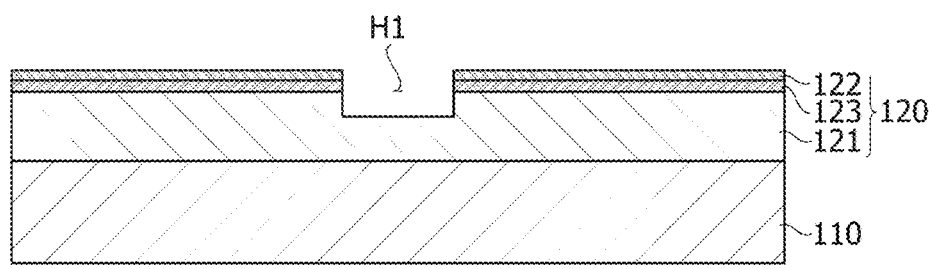

[FIG. 10C]
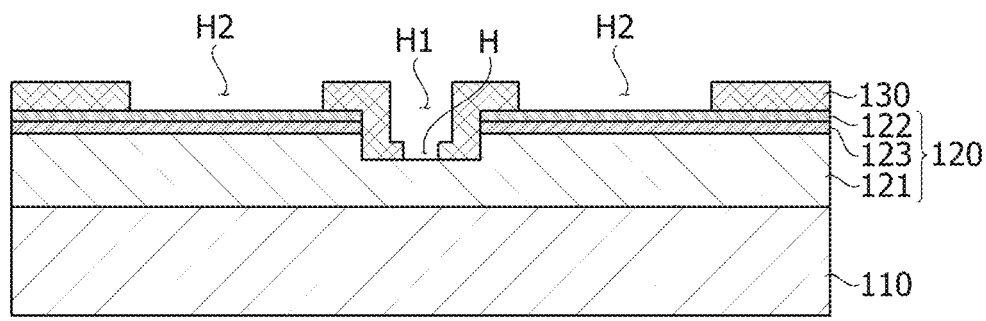
[FIG. 10D]
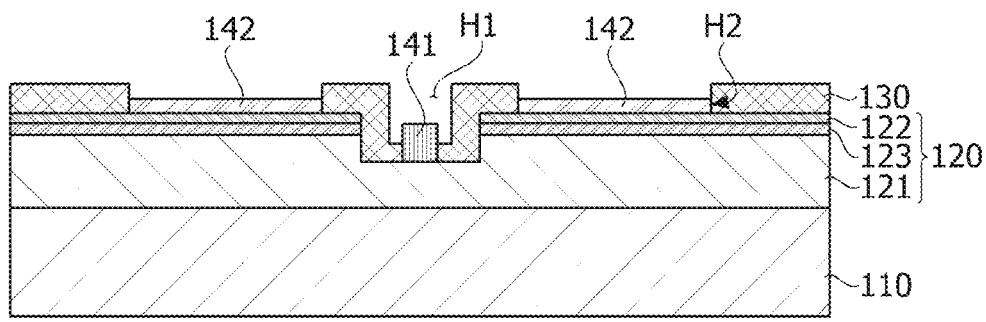
[FIG. 10E]
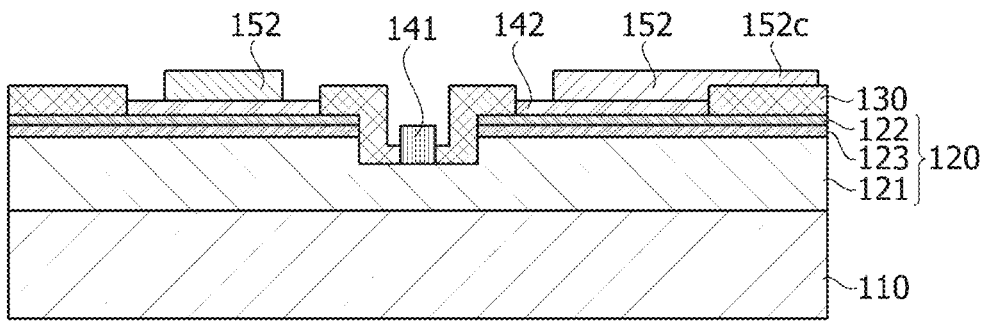

[FIG. 10F]
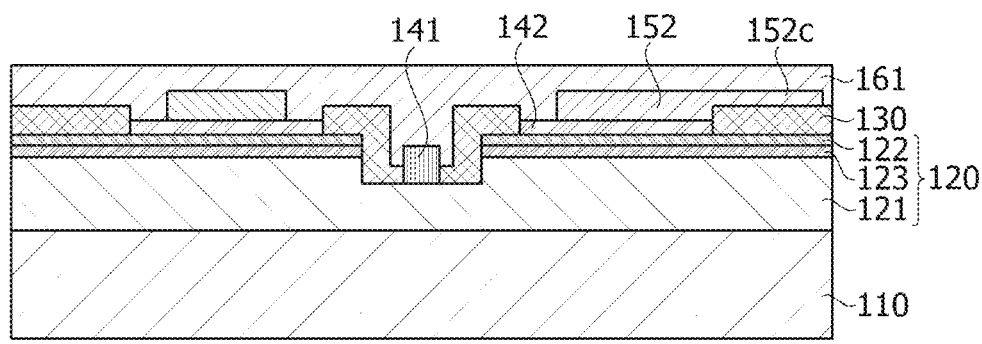
[FIG. 10G]
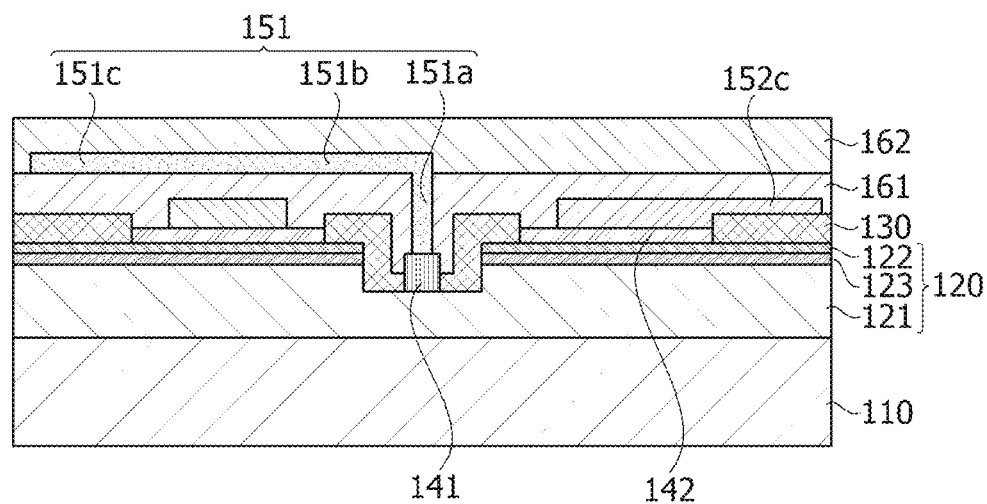

[FIG. 10H]
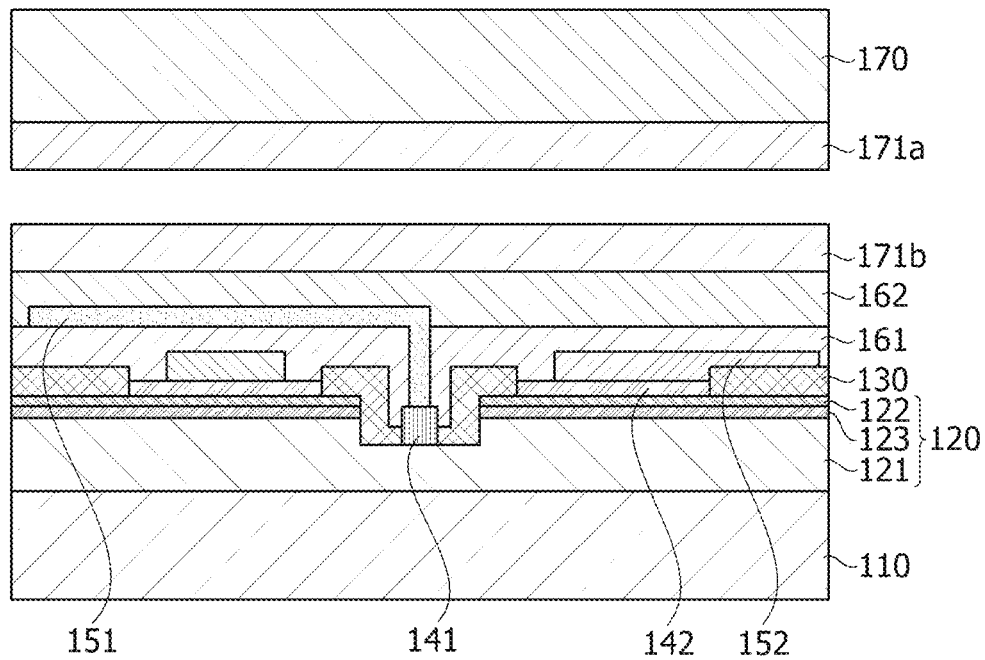
[FIG. 10I]
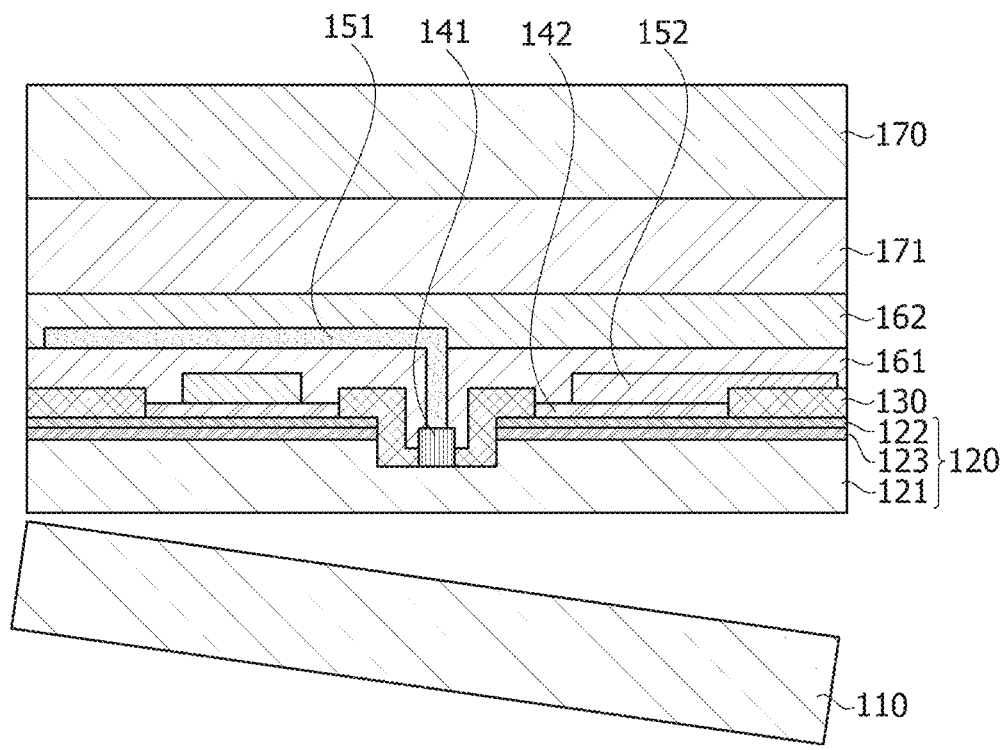

[FIG. 10J]
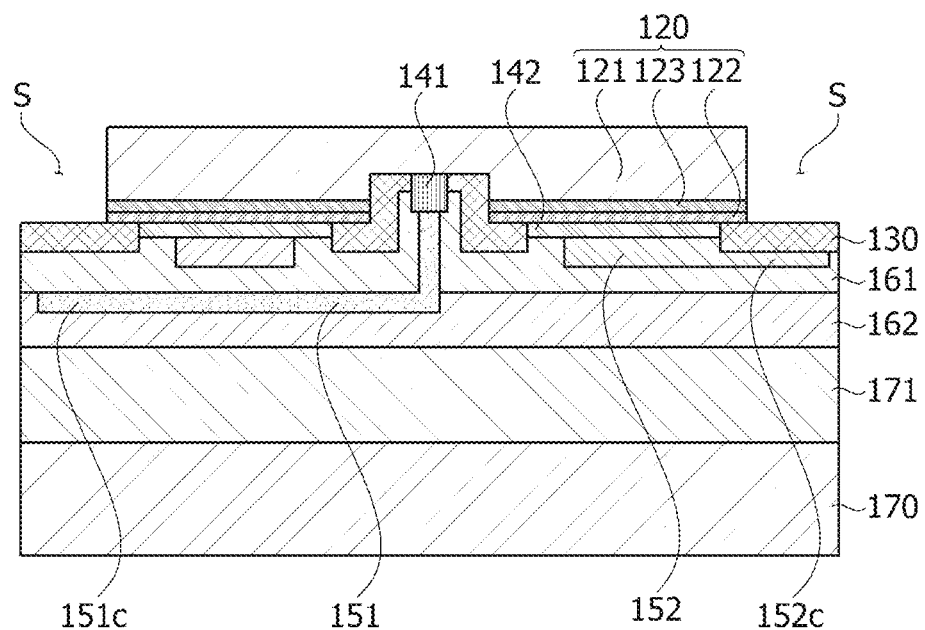
[FIG. 10K]
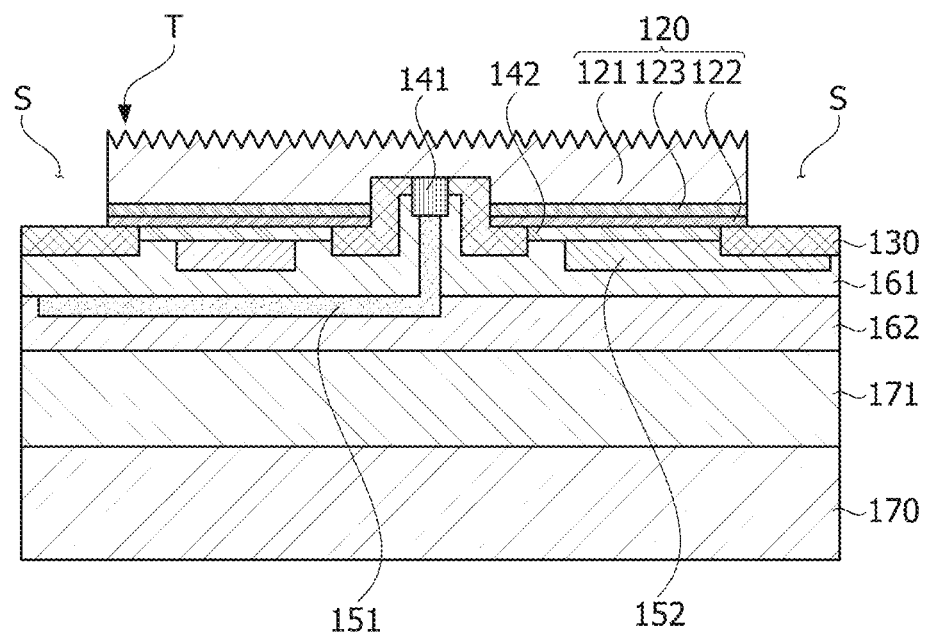

[FIG. 10L]
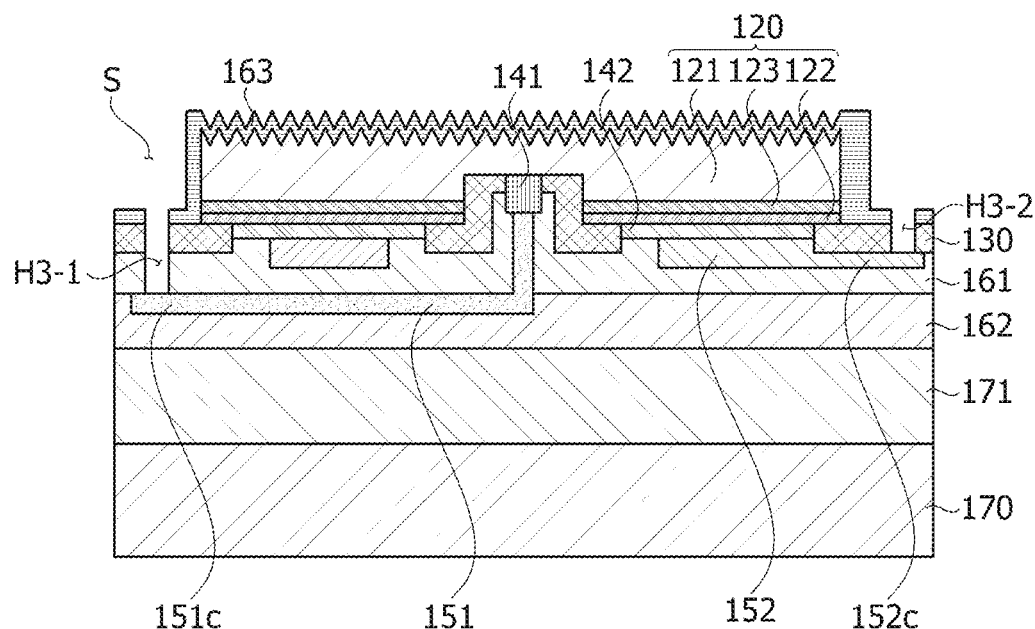
[FIG. 10M]
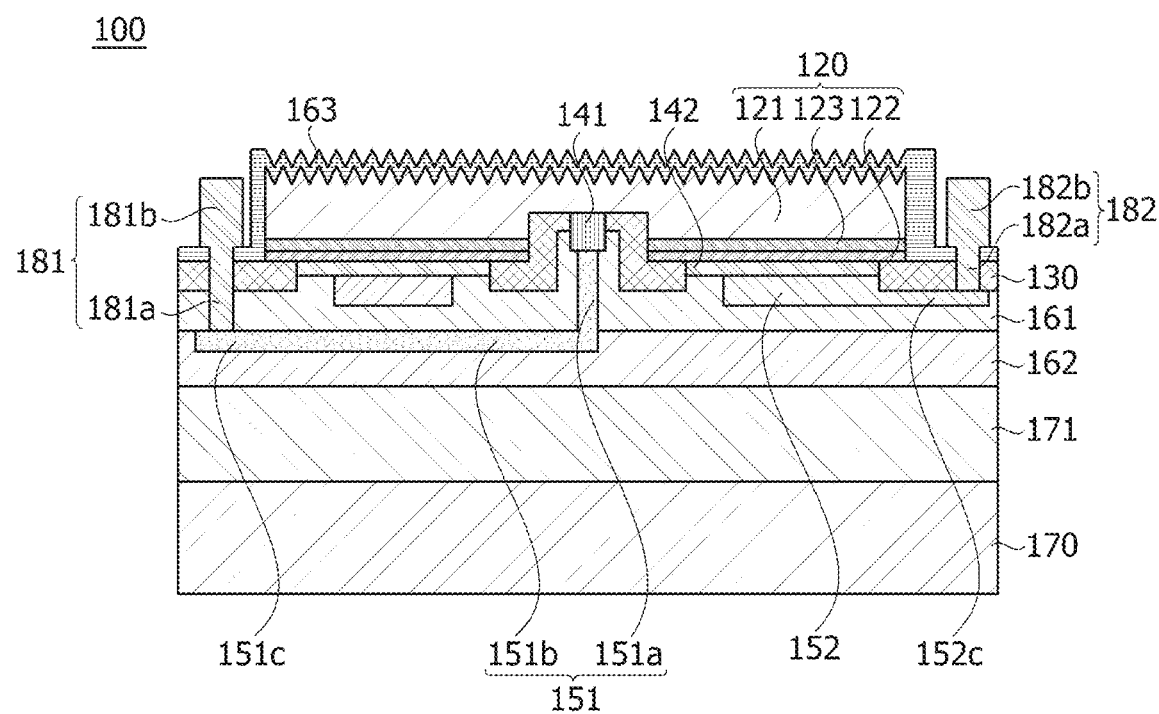

SEMICONDUCTOR DEVICE AND HEAD LAMP COMPRISING SAME

CROSS-REFERENCE TO RELATED PATENT APPLICATIONS

This application is a U.S. National Stage Application under 35 U.S.C. § 371 of PCT Application No. PCT/KR2018/010112, filed Aug. 31, 2018, which claims priority to Korean Patent Application No. 10-2017-0111229, filed Aug. 31, 2017, whose entire disclosures are hereby incorporated by reference.

FIELD OF THE INVENTION

An embodiment relates to a semiconductor device and a head lamp including the same.

BACKGROUND ART

Since semiconductor devices including compounds, such as GaN and AlGaN, have many advantages in that energy band gaps are wide and easy to adjust, the semiconductor devices may be variously used for light-emitting devices, light-receiving devices, various diodes, and the like.

Particularly, light-emitting devices such as light-emitting diodes (LEDs) or laser diodes using a Group III-V or Group II-VI compound semiconductor material may implement various colors of light such as red light, green light, blue light, and ultraviolet light with the development of thin-film growth technology and element materials and also realize white light having high efficiency by using a fluorescent material or combining colors, and the light-emitting devices have advantages such as low power consumption, semi-permanent lifespan, fast response speed, safety, and eco-friendliness as compared to the conventional light sources such as fluorescent lamps, incandescent lamps, and the like.

Further, when light-receiving devices such as photodetectors or solar cells are manufactured using a Group III-V or Group II-VI compound semiconductor material, it is possible to utilize light in various wavelength ranges from gamma rays to radio wavelength ranges as a photoelectric current is generated by absorbing light in various wavelength ranges with the development of element materials. In addition, the light-receiving devices have advantages such as fast response speed, safety, eco-friendliness, and easy adjustment of element materials and thus may be easily used for power control, microwave circuits, or communication modules.

Accordingly, the application of the semiconductor devices is being extended to transmission modules of optical communication means, LED backlights capable of replacing cold cathode fluorescence lamps (CCFLs) included in backlights of liquid crystal display (LCD) devices, white LED lighting devices capable of replacing fluorescent lamps or incandescent bulbs, vehicle head lamps, signal lamps, sensors configured to sense gas or fire, and the like. In addition, the application of the semiconductor devices may be extended to high-frequency application circuits, other power control devices, and communication modules.

For a vehicle head lamp, a plurality of light-emitting devices (chips) may be formed as a package and used. Particularly, in recent years, there is an increasing interest in a head lamp capable of independently lighting a plurality of chips. Here, in order for the plurality of chips to be shown as a single light source, an interval between the chips should be minimized, but in this case, a problem such as a short circuit or the like may occur.

However, when the interval between the chips is decreased too much, there is a problem in that even when some chips are turned off, turned-off regions are not distinguished due to light emitted from chips adjacent to the turned-off chips. That is, when the interval between the chips is decreased, there is a problem in that contrast is lowered. In particular, when a wavelength conversion layer is disposed on the chips, the contrast problem may be further deteriorated.

SUMMARY OF THE INVENTION

An embodiment is directed to providing a semiconductor device in which the contrast of a plurality of light-emitting structures is improved.

Objectives to be solved by the embodiment are not limited to the above-described objective and will include objectives and effectiveness which may be identified by solutions for the objectives and the embodiments described below.

One aspect of the present invention provides a semiconductor device including a substrate, a plurality of semiconductor structures disposed at a center part of the substrate, a first pad and a second pad disposed on an edge part of the substrate, a first wiring line electrically connecting the first pad to at least one of the plurality of semiconductor structures, a second wiring line electrically connecting the second pad to at least one of the plurality of semiconductor structures, and a wavelength conversion layer disposed on the plurality of semiconductor structures, wherein the plurality of semiconductor structures are disposed to be spaced apart from each other in a first direction and a second direction, the first direction and the second direction cross each other, a separation distance between the plurality of semiconductor structures is in a range of 5 μm to 40 μm, and a thickness of the wavelength conversion layer is in a range of 1 μm to 50 μm.

Advantageous Effects

According to an embodiment, the contrast of a plurality of semiconductor structures can be improved.

A light-emitting region can be increased by disposing a plurality of semiconductor elements on one substrate.

According to the embodiment, processability can be improved by simultaneously forming a plurality of semiconductor elements on one substrate.

Various useful advantages and effects of the present invention are not limited to the above-described advantages, and may be more easily understood in a process in which specific embodiments are described.

BRIEF DESCRIPTION OF THE DRAWINGS

FIG. 1 is a plan view of a semiconductor device according to an embodiment of the present invention.

FIG. 2 is a side view of the semiconductor device according to the embodiment of the present invention.

FIG. 3 is a graph obtained by measuring contrast when one semiconductor structure is turned off.

FIGS. 4A to 4F are photographs which are each obtained by measuring contrast according to each embodiment.

FIG. 5 is a graph obtained by measuring contrast when two semiconductor structures are turned off.

FIGS. 6A to 6F are photographs which are each obtained by measuring contrast according to each embodiment.

FIG. 7 is a conceptual diagram of a semiconductor element according to the embodiment of the present invention.

FIG. 8A is a cross-sectional view of region II of FIG. 1.

FIG. 8B is a cross-sectional view of region III of FIG. 1.

FIG. 8C is a plan view illustrating a connection structure of first wiring lines and second wiring lines of FIG. 1.

FIG. 9A illustrates the first wiring lines of FIG. 1 in detail.

FIG. 9B illustrates the second wiring lines of FIG. 1 in detail.

FIG. 9C is a conceptual diagram of a semiconductor device package according to the embodiment of the present invention.

FIGS. 10A to 10M sequentially illustrate a method of manufacturing the semiconductor device according to the embodiment of the present invention.

DETAILED DESCRIPTION

The present embodiment may be modified in other forms, or several embodiments may be combined with each other. The scope of the present invention is not limited to each of the embodiments described below.

Although a description given in a specific embodiment is not given in other embodiments, the description may be understood to be descriptions of other embodiments as long as there are no opposite or inconsistent descriptions given.

For example, when a feature of a component A is described in a specific embodiment and a feature of a component B is described in another embodiment, the scope of the present invention includes an embodiment in which the components A and B are combined even when the embodiment is not clearly described as long as there are no opposite or inconsistent descriptions given.

In the description of the embodiment, in a case in which any one element is described as being formed "on" or "under" another element, such a description includes both a case in which the two elements are formed to be in direct contact with each other and a case in which the two elements are in indirect contact with each other such that one or more other elements are interposed between the two elements. In addition, when an element is described as being formed "on" or "under" another element, the description may include the meaning of the other element being formed in an upward direction from the element and formed in a downward direction from the element.

A semiconductor device may include various electronic devices such as a light-emitting device, a light-receiving device, and the like, and both of the light-emitting device and the light-receiving device may include a first conductive semiconductor layer, an active layer, and a second conductive semiconductor layer.

A semiconductor device according to the present embodiment may be a light-emitting device.

The light-emitting device emits light by recombination of electrons and holes, and a wavelength of the light is determined by an intrinsic energy band gap of a material. Thus, the emitted light may be varied according to the composition of the material.

Hereinafter, an embodiment of the present invention will be described in detail with reference to the accompanying drawings so that those skilled in the art may easily perform the present invention.

FIG. 1 is a plan view of a semiconductor device according to an embodiment of the present invention, and FIG. 2 is a side view of the semiconductor device according to the embodiment of the present invention.

Referring to FIGS. 1 and 2, the semiconductor device according to the embodiment includes a substrate 170, a plurality of semiconductor structures 100A disposed in a center part C1 of the substrate 170, a plurality of first pads 181-$n$ and a plurality of second pads 182-$n$ disposed in an edge part P1 of the substrate 170, first wiring lines 151 each electrically connecting at least one of the plurality of semiconductor structures 100A to each of the first pads 181-$n$, second wiring lines 152 each electrically connecting at least one of the plurality of semiconductor structures 100A to each of the second pads 182-$n$, and a wavelength conversion layer 190 disposed on the plurality of semiconductor structures 100A.

The substrate 170 may serve to support the semiconductor device. The substrate 170 may be a ceramic substrate. Accordingly, heat dissipation characteristics may be improved through the substrate 170. In particular, the manufacturing process, package mounting, and heat dissipation of the semiconductor device may be easily performed due to the substrate 170 and thus the reliability of the device may be improved. However, the present invention is not necessarily limited thereto, and the substrate 170 may be a metal substrate of various materials.

The substrate 170 may include the center part C1 including a center and the edge part P1 surrounding the center part C1 in a plan view.

The plurality of semiconductor structures 100A may be disposed in the center part C1 of the substrate 170. The plurality of semiconductor structures 100A may be disposed to be spaced apart from each other in a first direction (X direction) and a second direction (Y direction). The first direction and the second direction may be perpendicular to each other, but the present invention is not necessarily limited thereto.

The plurality of semiconductor structures 100A may be disposed in the center part C1 of the substrate 170. The plurality of semiconductor structures 100A disposed in the center part of the substrate 170 may form a light-emitting part. Here, it is illustrated that 16 semiconductor structures 100A were disposed both vertically and horizontally, but the present invention is not limited thereto. A size of each of the semiconductor structures 100A may be 500×500 μm or less. That is, horizontal and vertical lengths may each be 500 μm or less. For example, the size of each of the semiconductor structures 100A may be 300×300 μm, 250×250 μm, or 110×110 μm. However, the present invention is not limited thereto.

The plurality of semiconductor structures 100A may be manufactured by growing one semiconductor structure layer and then dividing the semiconductor structure layer into a plurality of portions, but the present invention is not necessarily limited thereto. Here, the interval between the plurality of semiconductor structures 100A is very small, and thus light output from the plurality of semiconductor structures 100A may be recognized as light output from one light source.

The plurality of semiconductor structures 100A may output light of a visible light wavelength band. The plurality of semiconductor structures 100A may output light of the same wavelength band but are not necessarily limited thereto and may output light of different wavelength bands depending on a growth method. Alternatively, the wavelength conversion layer 190 to be described below may be adjusted to convert the light into light of another wavelength band. The plurality of semiconductor structures 100A may generate a specific character or image.

The plurality of first pads 181-$n$ and the plurality of second pads 182-$n$ may be disposed in the edge part P1 of the substrate 170. According to the embodiment, since the first pads 181-$n$ and the second pads 182-$n$ connected to the plurality of semiconductor structures 100A are disposed in the edge part P1, the wiring may be facilitated.

An insulating layer 163 may be disposed on the edge part P1 and the semiconductor structures 100A of the substrate. Here, the plurality of first wiring lines 151 and the plurality of second wiring lines 152 may be disposed below the semiconductor structures 100A. Each of the first wiring lines 151 may electrically connect at least one semiconductor structure 100A to the first pad 181-$n$. In addition, each of the second wiring lines 152 may electrically connect at least one semiconductor structure 100A to the second pad 182-$n$.

In the embodiment, the edge part P1 in which the first pads 181-$n$ and the second pads 182-$n$ are disposed may be a region in which the semiconductor structures 100A are removed. That is, after the wiring lines 151 and 152 and the semiconductor structure 100A are disposed on the substrate 170, the semiconductor structure 100A disposed in the edge part P1 may be removed. Here, the semiconductor structure 100A disposed in the center part C1 may be divided into a plurality.

However, the first wiring lines 151 and the second wiring lines 152 disposed below the semiconductor structure 100A are not removed so that the first wiring lines 151 and the second wiring lines 152 may be extended up to an edge region.

Accordingly, the first pad 181-$n$ and the second pad 182-$n$ may be electrically connected to the first wiring line 151 and the second wiring line 152, respectively, through the insulating layer 163 disposed on the edge part P1.

The wavelength conversion layer 190 may be disposed above the semiconductor structures 100A. The wavelength conversion layer 190 may convert light emitted from the semiconductor structure 100A into white light. The wavelength conversion layer 190 may include various fluorescent particles capable of converting the light emitted from the semiconductor structure 100A into white light. As an example, when the light emitted from the semiconductor structure 100A is blue light, the wavelength conversion layer 190 may include yttrium-aluminum-garnet (YAG) phosphors. However, the present invention is not necessarily limited thereto, and the phosphor may be changed to a suitable phosphor in consideration of the wavelength of the emitted light or the characteristics of the phosphor.

Referring to FIG. 2, the first and second wiring lines may be disposed above the substrate 170, and the plurality of semiconductor structures 100A may be disposed above the first and second wiring lines. In addition, the wavelength conversion layer 190 may be disposed on the plurality of semiconductor structures 100A.

Here, a separation distance d1 between the semiconductor structures 100A may be 5 µm to 100 µm or 5 µm to 40 µm. When the separation distance d1 is 5 µm or more, a short circuit between the semiconductor structures 100A may be prevented, and when the separation distance d1 is 100 µm or less, the light emitted from the plurality of semiconductor structures 100A may be externally recognized as light emitted from one light source. When the separation distance d1 is 40 µm or less, the probability of being externally recognized as light emitted from one light source may be higher.

A thickness d2 of the wavelength conversion layer 190 disposed on upper surfaces of the semiconductor structures 100A may be 1 µm or more and 50 µm or less. When the thickness of the wavelength conversion layer 190 is 1 µm or more, the light emitted from the semiconductor structure 100A may be converted into white light, and when the thickness d2 is 50 µm or less, a non-light-emitting region may be clearly recognized when some semiconductor structures 100A are turned off. That is, a contrast ratio (contrast) may be improved.

The thickness d2 of the wavelength conversion layer 190 may be greater than a thickness d4 of the semiconductor structure 100A. According to the embodiment, since the semiconductor structure 100A is micro sized unlike a general light-emitting device, the semiconductor structure 100A may be smaller than the thickness of the wavelength conversion layer 190

As an example, the thickness d4 of the semiconductor structure 100A according to the embodiment may be about 1 µm or more and 30 µm or less. On the other hand, the wavelength conversion layer 190 may have a thickness of about 10 µm to implement sufficient white light.

A ratio (d3:d4) of a width d3 of the semiconductor structure 100A in the first direction to the separation distance d1 between the plurality of semiconductor structures 100A may range from 1:8 to 6:1. That is, the width of the semiconductor structure 100A in the first direction may be greater, and the separation distance of the semiconductor structure 100A may be greater. As an example, the width of the semiconductor structure 100A in the first direction may be 5 µm to 100 µm.

FIG. 3 is a graph obtained by measuring contrast when one semiconductor structure is turned off, FIGS. 4A to 4F are photographs which are each obtained by measuring contrast according to each embodiment, FIG. 5 is a graph obtained by measuring contrast when two semiconductor structures 100A are turned off, and FIGS. 6A to 6F are photographs which are each obtained by measuring contrast according to each embodiment.

Referring to Table 1 below and FIGS. 3 to 4F, semiconductor devices were fabricated by varying the coating method, thickness, and average particle diameter of phosphors, and one light-emitting structure was turned off to measure a light-emitting region P1 and a non-light-emitting region P2.

TABLE 1

| | Coating method | Thickness (µm) | Average particle diameter (D50) | Contrast (minimum in plane/maximum in plane) |
|---|---|---|---|---|
| Experimental Example 1 | phosphor plate | 120 | 20 | 0.233 |
| Experimental Example 2 | conformal coating | 60 | 20 | 0.046 |
| Experimental Example 3 | electrostatic coating (two times) | 40 | 20 | 0.015 |
| Experimental Example 4 | electrostatic coating (four times) | 30 | 5 | 0.011 |
| Experimental Example 5 | impact-pulse coating | 30 | 20 | 0.043 |
| Experimental Example 6 | impact-pulse coating | 50 | 5 | 0.033 |

Referring to FIGS. 3 and 4A, it may be confirmed that most of the non-light-emitting region P2 was measured to emit light in the case of Experimental Example 1. This is because the thickness of the wavelength conversion layer 190 is too great to 120 μm and thus the light emitted from the adjacent semiconductor structures 100A enters the non-light-emitting region. When the interval between the semiconductor structures 100A is sufficiently great, the contrast may not be affected even when the thickness of the wavelength conversion layer 190 is increased. However, when the semiconductor structures 100A are densely disposed with an interval of 5 μm to 100 μm or 5 μm to 40 μm, the thickness of the wavelength conversion layer 190 may affect the contrast.

Referring to FIGS. 3 and 4B, in the case of Experimental Example 2, the thickness was decreased to 60 μm so that the non-light-emitting region P2 was observed as compared with Experimental Example 1, and thus it may be confirmed that the contrast was improved. However, a portion of the non-light-emitting region P2 was observed to emit light and thus it may be confirmed that the contrast was not sufficient.

Referring to FIGS. 3 and 4C, in the case of Experimental Example 3, it may be confirmed that the contrast of the light-emitting region P1 and the non-light-emitting region P2 was improved when the thickness of phosphors was further decreased to 40 μm. That is, it was observed that most of the non-light-emitting region P2 did not emit light. Accordingly, it may be confirmed that contrast may be obtained to an extent sufficient to enable independent lighting when the thickness of the wavelength conversion layer is less than 60 μm.

Referring to FIGS. 3 and 4D, it may be confirmed that the contrast was relatively improved in the case of Experimental Example 4 in which the wavelength conversion layer 190 was formed using phosphors having a size less than that of the phosphors of Experimental Example 3. Thus, it may be confirmed that the contrast may be effectively improved when an average particle diameter D50 of the fluorescent particles is controlled to be 20 μm or less.

The thickness of the wavelength conversion layer may be 10 μm to 30 μm, and an average diameter D50 of wavelength conversion particles may be 1 μm to 20 μm. When the thickness of the wavelength conversion layer is 10 μm or more, the wavelength conversion layer may have a thickness sufficient to convert the wavelength of the light, and when the thickness is 30 μm or less, the contrast may be improved. In addition, the contrast may be further improved when the average diameter D50 is in a range of 1 μm to 20 μm.

In the case of Experimental Example 5 of FIG. 4E and Experimental Example 6 of FIG. 4F in which the wavelength conversion layer 190 is formed using an impact-pulse coating method, it may be confirmed that the contrast was lowered as compared with the Experimental Examples 3 and 4. Accordingly, it may be confirmed that the contrast may be improved when an electrostatic coating method (electrostatic spray) is used as the coating method rather than the impact-pulse coating method. It is determined that the impact-pulse coating method is available for thin film coating but has low contrast due to the increased resin component.

Referring to Table 2 below and FIGS. 5 to 10F, semiconductor devices were fabricated by varying the coating method, thickness, and average particle diameter of phosphors, and two light-emitting structures were turned off to form a non-light-emitting region P2 and to measure contrast. In this case, the measurement was performed in the same manner as in Table 1 except that the experiment was performed after increasing the non-light-emitting region. As a result, it may be confirmed that the non-light-emitting region was increased and thus the overall contrast was improved, but the same tendency as in Table 1 was shown.

TABLE 2

| | Coating method | Thickness (μm) | Average particle diameter (D50) | Contrast (minimum in plane/ maximum in plane) |
|---|---|---|---|---|
| Experimental Example 7 | phosphor plate | 120 | 20 | 0.203 |
| Experimental Example 8 | conformal coating | 60 | 20 | 0.020 |
| Experimental Example 9 | electrostatic coating (two times) | 40 | 20 | 0.0041 |
| Experimental Example 10 | electrostatic coating (four times) | 30 | 5 | 0.0036 |
| Experimental Example 11 | impact-pulse coating | 30 | 20 | 0.010 |
| Experimental Example 12 | impact-pulse coating | 50 | 5 | 0.0097 |

It may be confirmed that, in Experimental Example 7, most of the non-light-emitting region P2 was measured to emit light as shown in FIG. 6A. It may be confirmed that, in Experimental Example 8, a portion of the non-light-emitting region still emits light even though the contrast was improved compared to Experimental Example 7 as shown in FIG. 6B. In the case of Experimental Example 9, the contrast was improved by controlling the thickness of the wavelength conversion layer to 40 μm to be small as shown in FIG. 6C. According to such a configuration, contrast may be implemented to an extent sufficient to enable independent lighting of the semiconductor structures.

It may be confirmed that the contrast was further improved by decreasing the average particle diameter of the fluorescent particles to be 5 μm in the case of Experimental Example 10.

FIG. 7 is a conceptual diagram of a semiconductor element according to the embodiment of the present invention.

Referring to FIG. 7, a semiconductor element 100A according to the embodiment of the present invention may include a semiconductor structure 120, a protective layer 130, electrodes 141 and 142, first and second wiring lines 151 and 152, insulating layers 161, 162, and 163, and pads 181 and 182. In addition, the semiconductor element 100A may be disposed above the substrate 170. It should be understood that each of the plurality of semiconductor structures described above corresponds to a semiconductor device or a semiconductor structure of the semiconductor device. In the following, a description will be given assuming that one semiconductor structure described above corresponds to the semiconductor structure of the semiconductor device.

Meanwhile, it is illustrated in FIG. 7 that one semiconductor structure 120 is disposed between two pads 181 and 182 for the convenience of description. However, in practice, as illustrated in FIG. 1, a plurality of semiconductor structures 120 may be disposed above the substrate 170 to be spaced apart from each other at predetermined intervals, and a plurality of pads 181 and 182 may be disposed to surround the edge part of the substrate 170. In addition, FIG. 7 may be a cross-sectional view taken along line I having a V-shape in FIG. 1. FIG. 8 will be described below.

The substrate 170 may serve to support the semiconductor element 100A. The substrate 170 may be a ceramic substrate. Accordingly, heat dissipation characteristics may be improved through the substrate 170. In particular, the manufacturing process, package mounting, and heat dissipation of the semiconductor device 100 may be easily performed due to the substrate 170 so that the reliability of the device may be improved. However, the present invention is not necessarily limited thereto, and the substrate 170 may be a metal substrate of various materials.

A bonding layer 171 may bond the substrate 170 to the semiconductor structure 120. In other words, the semiconductor structure 120 and underlying structures connected thereto may be disposed above the substrate 170 through the bonding layer 171. The bonding layer 171 may include at least one from among AuSn, NiSn, AuIn, CuSn, SiO2, and resin, but the present invention is not limited thereto.

The semiconductor structure 120 may be disposed above the substrate 170. The semiconductor structure 120 may include a first conductive semiconductor layer 121, a second conductive semiconductor layer 122, and an active layer 123 disposed between the first conductive semiconductor layer 121 and the second conductive semiconductor layer 122. It is illustrated in the drawing that the first conductive semiconductor layer 121 is directed upward and the second conductive semiconductor layer 122 is directed toward the substrate 170, but the present invention is not limited thereto.

The first conductive semiconductor layer 121 may be formed of at least one from among a Group III-V compound semiconductor, a Group II-VI compound semiconductor, and the like. The first conductive semiconductor layer 121 may be made of a semiconductor material having a composition formula $In_xAl_yGa_{1-x-y}N$ ($0 \le x \le 1$, $0 \le y \le 1$, and $0 \le x+y \le 1$) or a material selected from among AlInN, AlGaAs, GaP, GaAs, GaAsP, and AlGaInP. The first conductive semiconductor layer 121 may be doped with a first dopant. The first dopant may be an n-type dopant such as Si, Ge, Sn, Se, and Te. That is, the first conductive semiconductor layer 121 may be an n-type semiconductor layer doped with an n-type dopant.

Meanwhile, an irregular structure may be formed on the first conductive semiconductor layer 121. The irregular structure may improve light extraction efficiency of the semiconductor structure 120.

The second conductive semiconductor layer 122 may be formed of at least one from among a Group III-V compound semiconductor, a Group II-VI compound semiconductor, and the like. The second conductive semiconductor layer 122 may be made of a semiconductor material having a composition formula $In_xAl_yGa_{1-x-y}N$ ($0 \le x \le 1$, $0 \le y \le 1$, and $0 \le x+y \le 1$) or a material selected from among AlInN, AlGaAs, GaP, GaAs, GaAsP, and AlGaInP. The second conductive semiconductor layer 122 may be doped with a second dopant. The second dopant may be a p-type dopant such as Mg, Zn, Ca, Sr, and Ba. That is, the second conductive semiconductor layer 122 may be a p-type semiconductor layer doped with a p-type dopant.

The active layer 123 may be disposed between the first conductive semiconductor layer 121 and the second conductive semiconductor layer 122. The active layer 123 is a layer in which electrons (or holes) injected through the first conductive semiconductor layer 121 and holes (or electrons) injected through the second conductive semiconductor layer 122 meet. The active layer 123 may transition to a low energy level due to the recombination of electrons and holes and emit light having a wavelength corresponding thereto.

The active layer 123 may have any one structure from among a single well structure, a multi well structure, a single quantum well structure, a multi quantum well (MQW) structure, a quantum dot structure, and a quantum wire structure, but the present invention is not limited thereto. When the active layer 123 is formed in a well structure, a well layer/barrier layer of the active layer 123 may have a pair structure of any one or more from among InGaN/GaN, InGaN/InGaN, GaN/AlGaN, InAlGaN/GaN, GaAs(InGaAs)/AlGaAs, and GaP(InGaP)/AlGaP, but the present invention is not limited thereto. The well layer may be formed of a material having a band gap that is smaller than a band gap of the barrier layer.

Meanwhile, the semiconductor structure 120 may include a first hole H1 having a predetermined depth. Specifically, the first hole H1 may be formed by mesa-etching from the second conductive semiconductor layer 122 to a partial region of the first conductive semiconductor layer 121. The first hole H1 may be disposed in a direction facing the substrate 170. The first conductive semiconductor layer 121 may be partially exposed through the first hole H1. Accordingly, a first electrode 141 and the first wiring line 151 which will be described below may be electrically connected to the first conductive semiconductor layer 121.

The protective layer 130 may be disposed in a partial region of the semiconductor structure 120. In addition, the protective layer 130 may be disposed to protrude further from a side surface of the semiconductor structure 120. Here, the protective layer 130 may be disposed between the substrate 170 and the semiconductor structure 120.

Specifically, the protective layer 130 may cover the first hole H1 and the second conductive semiconductor layer 122 in the periphery of the first hole H1. In this case, the protective layer 130 may be disposed such that the first conductive semiconductor layer 121 is partially exposed in the first hole H1. In addition, the protective layer 130 may partially cover the second conductive semiconductor layer 122. Thus, the protective layer 130 may partially expose the second conductive semiconductor layer 122 through the second hole.

The protective layer 130 may be made of an insulating material. Specifically, the protective layer 130 may be made of a nonconductive oxide or nitride. For example, the protective layer 130 may be made of one selected from among a silicon oxide (SiO2) layer, a silicon nitride (Si3N4) layer, a titanium oxide (TiOx) layer, and an aluminum oxide (Al2O3) layer, but the present invention is not limited thereto.

The protective layer 130 may electrically insulate the semiconductor structure 120 from other regions. That is, the first and second conductive semiconductor layers 121 and 122 exposed due to the protective layer 130 may be electrically insulated from each other. In addition, the protective layer 130 may protect components below the protective layer 130 when the semiconductor structure 120 is etched, which will be described below. In addition, the protective layer 130 stably supports the semiconductor device 100 to protect the semiconductor device 100 from damage that may occur during a manufacturing process.

The electrodes 141 and 142 may include the first electrode 141 and a second electrode 142. The first electrode 141 may be disposed on the first conductive semiconductor layer 121, and the second electrode 142 may be disposed below the second conductive semiconductor layer 122.

Specifically, the first electrode 141 may be disposed on the first conductive semiconductor layer 121 exposed due to the protective layer 130. That is, the first electrode 141 may be disposed in the first hole H1. The second electrode 142 may be disposed on the second conductive semiconductor layer 122 exposed due to the protective layer 130. That is, the second electrode 142 may be disposed in a second hole H2 (see FIG. 10C).

The first and second electrodes 141 and 142 may include a material with high reflectivity. For example, the first and second electrodes 141 and 142 may be made of any one selected from among Ti, Ru, Rh, Ir, Mg, Zn, Al, In, Ta, Pd, Co, Ni, Si, Ge, Ag, Pt, and Au, or an alloy thereof. In this case, light generated from the semiconductor structure 120 may be emitted upward (a direction toward the first conductive semiconductor layer 121). Accordingly, the light extraction efficiency of the semiconductor element 100A may be improved. However, the present invention is not necessarily limited thereto, and the first and second electrodes 141 and 142 may include various materials for ohmic contact.

The wiring lines 151 and 152 may include the first wiring lines 151 and the second wiring lines 152. The first wiring line 151 may be electrically connected to the first electrode 141, and the second wiring line 152 may be electrically connected to the second electrode 142.

The insulating layers 161, 162, and 163 may include a first insulating layer 161, a second insulating layer 162, and a third insulating layer 163. The insulating layers 161, 162, and 163 may protect the components of the semiconductor device 100 and electrically insulate the adjacent components from each other. An insulating layer with high transmittance may be used as the insulating layers 161, 162, and 163. For example, the insulating layers 161, 162, and 163 may be made of any one selected from among SiO2, SixOy, Si3N4, SixNy, SiOxNy, TiO2, ZrO2, Si3N4, Al2O3, AlN, and MgF2, but the present invention is not limited thereto.

In detail, the second wiring line 152 may be disposed on the second electrode 142 between the semiconductor structure 120 and the substrate 170. The second wiring line 152 may extend toward an outer surface of the semiconductor structure 120 from the second electrode 142. In particular, the second wiring line 152 may include a second end part 152c that protrudes further than a line extending from the outer surface of the semiconductor structure 120. Meanwhile, it is illustrated that one second wiring line 152 is disposed in each of one side and the other side of the drawing, but in practice, these two second wiring lines 152 are connected to each other. That is, the hole may be formed in a center part of the second wiring line, and thus the second wiring line may be illustrated as being spaced apart from each other in the cross-sectional view. This may also be applied to the second electrode.

In other words, one end part of the second wiring line 152 may be connected to the second electrode 142. In addition, the second end part 152c of the second wiring line 152 may extend toward the edge part of the substrate 170 from one end part of the second wiring line 152. In addition, the second end part 152c may be electrically connected to a second pad 182 to be described below. In this case, the second end part 152c may be disposed below the semiconductor structure 120 to protrude further than the side surface of the semiconductor structure 120. Thus, the second wiring line 152 may be easily connected to the second pad 182 disposed on a side part of the semiconductor structure 120.

That is, as illustrated in FIG. 7, the second end part 152c of the second wiring line 152 may be disposed to protrude further than an edge part of the semiconductor structure 120 toward the edge part of the substrate 170. That is, the edge part of the semiconductor structure 120 may be etched such that the semiconductor structure 120 may be disposed only at a center part of the substrate (intersection regions between regions A, B, C, and D and regions E and F). Accordingly, the semiconductor structure 120 may expose the second end part 152c disposed at the edge part of the substrate. The second pad 182 may be electrically connected to the second end part 152c of the second wiring line 152 by passing through the third insulating layer 163 and the protective layer 130. Accordingly, the second wiring line 152, the protective layer 130, and the second pad 182 may overlap each other in a thickness direction of the substrate 170 at the edge part of the substrate 170.

The first insulating layer 161 may be disposed to cover the protective layer 130, the electrodes 141 and 142, and the second wiring line 152. Accordingly, the second wiring line 152 and the first wiring line 151 may be spaced apart and electrically insulated from each other due to the first insulating layer 161. In addition, the first insulating layer 161 may serve as a reflective layer. In this case, light emitted downward may be reflected upward by the first insulating layer 161 to improve light extraction efficiency. Meanwhile, the first insulating layer 161 may include a hole through which the first wiring line 151 passes.

The first wiring line 151 may be disposed between the semiconductor structure 120 and the substrate 170. In addition, the first wiring line 151 may extend toward an outer surface of the semiconductor structure 120 from the first electrode 141. The first wiring line 151 may include a first through part 151a, a first connection part 151b, and a first end part 151c. The first wiring line 151 may be spaced apart from the second wiring line 152 by the first insulating layer 161.

The first through part 151a may pass through the active layer 123, the second conductive semiconductor layer 122, and the first insulating layer 161. One end of the first through part 151a may be connected to the first electrode 141. The first through part 151a may extend toward the substrate 170 from the first electrode 141. The other end of the first through part 151a may be connected to one end of the first connection part 151b.

The first connection part 151b may extend along one surface of the first insulating layer 161 from one end thereof. The other end of the first connection part 151b may be connected to the first end part 151c.

The first end part 151c may protrude further than a line extending from the outer surface of the semiconductor structure 120. That is, the first end part 151c may extend toward the edge part of the substrate 170. Thus, the first wiring lines 151 may be easily connected to a first pad 181 disposed on a side part of the semiconductor structure 120.

That is, the first end part 151c of the first wiring line 151 may be disposed to protrude further than the edge part of the semiconductor structure 120 toward the edge part of the substrate 170. Accordingly, the first wiring line 151, the protective layer 130, and the first pad 181 may overlap each other in a vertical direction at the edge part P1 of the substrate 170.

The second insulating layer 162 may be disposed between the substrate 170 and the first insulating layer 161. The second insulating layer 162 may be disposed to cover a lower portion of each of the first insulating layer 161 and the first wiring line 151. Thus, the first wiring line 151 may be insulated and protected due to the second insulating layer 162. In addition, the second insulating layer 162 may serve as a reflective layer. In this case, light emitted downward may be reflected upward by the second insulating layer 162 to improve light extraction efficiency.

The third insulating layer 163 may cover a top of the semiconductor element. Specifically, the third insulating layer 163 may cover the semiconductor structure 120 and the protective layer 130. The first and second conductive semiconductor layers 121 and 122 and the active layer 123 exposed at the side surfaces of the semiconductor structure 120 may be electrically insulated from the pads 181 and 182 due to the third insulating layer 163. In addition, an upper surface of the third insulating layer 163 may include an irregular structure similar to the first conductive semiconductor layer 121.

The pads 181 and 182 may be disposed above the substrate 170 to be spaced apart from the semiconductor structure 120. Specifically, the pads 181 and 182 may be disposed to surround the semiconductor structure 120 at the side parts of the semiconductor structure 120 or at the edge parts of the substrate 170.

The pads 181 and 182 may include the first pad 181 and the second pad 182. The first pad 181 may be electrically connected to the first conductive semiconductor layer 121 through the first wiring line 151 and the first electrode 141. The second pad 182 may be electrically connected to the second conductive semiconductor layer 122 through the second wiring line 152 and the second electrode 142.

The first pad 181 may include a first region 181a and a second region 181b. One end of the first region 181a may be connected to the first end part 151c. In addition, the first region 181a may pass through the first insulating layer 161, the protective layer 130, and the third insulating layer 163. The second region 181b may be disposed to protrude from the third insulating layer 163.

The first pad 181 may be disposed to be spaced apart from the semiconductor structure 120. In particular, the first pad 181 may be disposed to be spaced apart from the side surface of the semiconductor structure 120 and the third insulating layer 163 covering the side surface of the semiconductor structure 120.

The second pad 182 may include a first region 182a and a second region 182b. One end of the first region 182a may be connected to the second end part 152c. In addition, the first region 182a may pass through the protective layer 130 and the third insulating layer 163. The second region 182b may be disposed to protrude from the third insulating layer 163.

The second pad 182 may be disposed to be spaced apart from the semiconductor structure 120. In particular, the second pad 182 may be disposed to be spaced apart from the side surface of the semiconductor structure 120 and the third insulating layer 163 covering the side surface of the semiconductor structure 120.

FIG. 8A is a cross-sectional view of region II of FIG. 1. FIG. 8B is a cross-sectional view of region III of FIG. 1. FIG. 8C is a plan view illustrating a connection structure of the first wiring lines and the second wiring lines of FIG. 1. FIG. 9A illustrates the first wiring lines of FIG. 1 in detail. FIG. 9B illustrates the second wiring lines of FIG. 1 in detail.

Referring to FIGS. 1 and 8A to 9B, in the semiconductor device 100 according to the present invention, the plurality of semiconductor elements 100A may be disposed on one substrate 170. Specifically, a plurality of semiconductor structures 100A (see FIG. 1), a plurality of wiring lines 151-n, a plurality of wiring lines 152-n, a plurality of pads 181-n, and a plurality of pads 182-n may be included on one substrate 170. That is, one semiconductor structure 120, one of each of the first and second wiring lines 151 and 152, and one of each of the first and second pads 181 and 182 are illustrated in FIG. 8A and FIG. 8B for the convenience of description, but in practice, these components may be provided as a plurality.

Specifically, the plurality of semiconductor structures 120 may be disposed above the substrate 170 to be spaced apart from each other, and the plurality of pads 181-n and 182-n may be disposed around the plurality of semiconductor structures 120. In addition, the plurality of wiring lines 151-n and 152-n may be formed between the semiconductor structures 120 and the substrate 170 and between the pads 181-n and 182-n and the substrate 170 to electrically connect the semiconductor structures 120 to the pads 181-n and 182-n. The semiconductor structures 120 may be connected to the pads 181-n and 182-n in a manner similar to that illustrated in FIG. 7 (the cross-sectional view of line I of FIG. 1). Meanwhile, it is illustrated in FIG. 1 that the first pads 181-n are disposed on upper and lower portions of the substrate 170 and the second pads 182-n are disposed on left and right portions of the substrate 170. However, in some cases, the positions and arrangement of the pads 181-n and 182-n and the wiring lines 151-n and 152-n may be changed. In addition, the number of the semiconductor structure 120, the wiring lines 151-n and 152-n, and the pads 181-n and 182-n may also be changed in some cases.

Specifically, referring to FIGS. 8A to 8C, the first end part 151c and the second end part 152c may protrude further outward than the line extending from the side surface of the semiconductor structure 120. In addition, the end parts 151c and 152c may be electrically connected to the pads 181-n and 182-n, respectively.

Meanwhile, the first wiring lines 151-n and the second wiring lines 152-n may be electrically connected to the plurality of semiconductor structures 120. Only two semiconductor structures 120 are illustrated in the drawings, but in practice, many semiconductor structures 120 may be disposed on side parts thereof as shown in FIG. 1.

Specifically, the first connection part 151b of the first wiring line 151-n may be disposed along one surface of the first insulating layer 161 between the substrate 170 and the plurality of semiconductor structures 120. In addition, the first through part 151a may extend from each of the semiconductor structures 120 to electrically connect the plurality of semiconductor structures 120 to one first connection part 151b.

Meanwhile, two first wiring lines 151-n may be disposed below one semiconductor structure 120. This will be described below.

Further, one second wiring line 152-n may be disposed along one surface of each of the plurality of second electrodes 142 between the substrate 170 and the plurality of semiconductor structures 120. Although the second wiring lines 152-n are illustrated in FIG. 8B as being spaced apart from each other with respect to the first wiring line 151-n, the space may mean a hole H4 formed in the second wiring line 152-n. That is, referring to FIG. 8C, the hole H4 may be formed in a partial region of the second wiring line 152-n to connect the semiconductor structure 120 to the first wiring line 151-n. In other words, the second wiring lines 152-n are illustrated as being spaced apart from each other in the cross-sectional view of FIG. 8B, but in practice, may mean one second wiring line 152-n as shown in FIG. 8C.

The plurality of first wiring lines 151-n (n≥1) may be disposed along first and second regions 170a and 170b of a peripheral part of the substrate 170. At this time, one (1-n)th wiring line 151-n may be electrically connected to four semiconductor elements 100A. A total of 32 (1-n)th wiring lines 151-n may be disposed in each of the first and second regions 170A and 170B. That is, two (1-n)th wiring lines 151-*n* may be disposed below one semiconductor element 100A. However, this is merely one example for describing the present invention and thus the present invention is not limited thereto. That is, the number of the semiconductor elements 100A connected to one (1-n)th wiring line 151-*n* and the number of the (1-n)th wiring lines 151-*n* disposed below one semiconductor element 100A may be changed. Hereinafter, for the convenience of description, the (1-n)th wiring lines 151-*n* disposed in the first region 170*a* are defined as a (1-1)th wiring line 151-1, a (1-2)th wiring line 151-2, to a (1-32)th wiring line 151-32 in a sequence from the left side.

In particular, referring to FIG. 9A together, the (1-n)th wiring lines 151-*n* (where n is an odd number) in odd-numbered lines are disposed to extend up to region B, and the (1-n)th wiring lines 151-*n* (where n is an even number) in even-numbered lines are disposed to extend up to region A. That is, the (1-n)th wiring lines 151-*n* (where n is an odd number) in the odd-numbered lines may be electrically connected to the semiconductor elements 100A disposed in the region B. The (1-n)th wiring lines 151-*n* (where n is an even number) in the even-numbered lines may be electrically connected to the semiconductor elements 100A disposed in the region A.

For example, the (1-1)th wiring line 151-1 may be electrically connected to four semiconductor elements 100A disposed in a first row on the left side of the region B. A (1-3)th wiring line 151-3 may be electrically connected to four semiconductor elements 100A disposed in a second row on the left side of the region B. This may be equally applied up to a (1-31)th wiring line 151-31.

Meanwhile, the (1-n)th wiring lines 151-*n* (where n is an odd number) may also be disposed below the semiconductor elements 100A disposed in the region A. However, the (1-n)th wiring lines 151-*n* (where n is an even number) may be electrically insulated from the semiconductor elements 100A in the region A through a separate configuration or the like. For example, the through part 151*a* (in FIG. 8A and FIG. 8B) of the wiring line may not be formed in a region in which the semiconductor element 100A of the region A overlaps the (1-n)th wiring line 151-*n* (where n is an odd number) (see FIGS. 10B and 10C). Thus, the wiring line may be electrically insulated from the semiconductor element 100A.

A (1-2)th wiring line 151-2 may be electrically connected to four semiconductor elements 100A disposed in a first row on the left side of the region A. A (1-4)th wiring line 151-4 may be electrically connected to four semiconductor elements 100A disposed in a second row on the left side of the region A. This may be equally applied up to the (1-32)th wiring line 151-32.

Meanwhile, this may be similarly applied to the second region 170*b*. That is, each of the (1-n)th wiring lines 151-*n* may be electrically connected to four semiconductor elements 100A. Also, the (1-n)th wiring lines 151-*n* (where n is an odd number) disposed in the odd-numbered lines may be electrically connected to the semiconductor elements 100A in region C. In addition, the (1-n)th wiring lines 151-*n* (where n is an even number) disposed in the even-numbered lines may be electrically connected to the semiconductor elements 100A in region D.

The plurality of second wiring lines 152-*n* (n≥1) may be disposed along third and fourth regions 170*c* and 170*d* of the peripheral part of the substrate 170. In this case, one (2-n)th wiring line 152-*n* may be electrically connected to eight semiconductor elements 100A. A total of 16 (2-*n*)th wiring lines 152-*n* may be disposed in each of the third and fourth regions 170*c* and 170*d*. That is, unlike the (1-n)th wiring lines 151-*n*, one (2-n)th wiring line 152-*n* may be disposed below one semiconductor element 100A. However, this is merely one example for describing the present invention and thus the present invention is not limited thereto. That is, the number of the semiconductor elements 100A connected to one (2-n)th wiring line 152-*n* and the number of the (2-n)th wiring lines 152-*n* disposed below one semiconductor element 100A may be changed.

Hereinafter, for the convenience of description, the second wiring lines 152-*n* disposed in the third region 170*c* are defined as a (2-1)th wiring line 152-1, a (2-2)th wiring line 152-2, . . . , and a (2-16)th wiring line 152-16 in a sequence from the upper side.

In particular, referring to FIG. 9B together, the (2-1)th wiring line 152-1 may be electrically connected to eight semiconductor elements 100A disposed in a first row on an upper portion of the region E. In addition, the (2-2)th wiring line 152-2 may be electrically connected to eight semiconductor elements 100A disposed in a second row on the upper portion of the region E. This may be equally applied up to the (2-16)th wiring line 152-16.

Meanwhile, this may be similarly applied to the fourth region 170*d*. That is, each of the (2-n)th wiring lines 152-*n* may be electrically connected to eight semiconductor elements 100A. That is, one (2-n)th wiring line 152-*n* may be electrically connected to eight semiconductor elements 100A of each row of the region F in a sequence from the upper side.

In this manner, each of the (1-n)th wiring lines 151-*n* may be electrically connected to four semiconductor elements 100A in each region, alternately, of the region B and the region A (or the region C and the region D) in a sequence from the left side. Here, the (1-n)th wiring lines 151-*n* may be electrically connected to the first conductive semiconductor layer 121 (in FIG. 8A and FIG. 8B) of the semiconductor element 100A.

Further, the (2-n)th wiring line 152-*n* may be electrically connected to eight semiconductor elements 100A of the region E (or the region F) in a sequence from the upper side. Here, the (2-n)th wiring lines 152-*n* may be electrically connected to the second conductive semiconductor layer 122 (in FIG. 8A and FIG. 8B) of the semiconductor element 100A.

The plurality of first pads 181-*n* (n≥1) may be disposed along the first and second regions 170*a* and 170*b* of the peripheral part of the substrate 170. Here, one (1-n)th pad 181-*n* may be disposed on each of the first wiring lines 151-*n*. That is, a total of 32 (1-n)th pads 181-*n* may be disposed in each of the first and second regions 170*a* and 170*b*. In addition, one (1-n)th pad 181-*n* may be electrically connected to four semiconductor elements 100A. However, this is merely one example for describing the present invention and thus the present invention is not limited thereto.

Specifically, the (1-n)th pads 181-*n* may be disposed in two lines in the first region 170*a*. That is, a total of 32 (1-n)th pads 181-*n* may be disposed in the first region 170*a*, with 16 (1-n)th pads 181-*n* in each of upper and lower portions of the first region 170*a*. Hereinafter, for the convenience of description, n in the (1-n)th pads 181-*n* disposed in a lower line is defined as an odd number, and n in the (1-n)th pads 181-*n* disposed in an upper line is defined as an even number.

That is, the (1-n)th pads 181-*n* (where n is an odd number) disposed in the lower line in the first region 170*a* may be defined as a (1-1)th pad 181-1, a (1-3)th pad 181-3, . . . , and a (1-31)th pad 181-31 in a sequence from the left side. The (1-n)th pads 181-$n$ (where n is an even number) disposed in the upper line in the first region 170$a$ may be defined as a (1-2)th pad 181-2, a (1-4)th pad 181-4, . . . , and a (1-32)th pad 181-32 in a sequence from the left side.

The (1-n)th pads 181-$n$ (where n is an odd number) disposed in the lower line may be disposed on the (1-n)th wiring lines 151-$n$ (where n is an odd number) of the odd-numbered lines, respectively. For example, referring to FIG. 8A together, the (1-1)th pad 181-1 may be electrically connected to the (1-1)th wiring line 151-1. Accordingly, the (1-1)th pad 181-1 may be electrically connected to four semiconductor elements 100A disposed in the first row on the left side of the region B. This may be equally applied up to the (1-31)th pad 181-31. That is, the (1-n)th pads 181-$n$ (where n is an odd number) disposed in the lower line may be electrically connected to the semiconductor elements 100A disposed in the region B.

The (1-n)th pads 181-$n$ (where n is an even number) disposed in the upper line may be disposed on the (1-n)th wiring lines 151-$n$ (where n is an even number) of the even-numbered lines, respectively. For example, the (1-2)th pad 181-2 may be electrically connected to the (1-2)th wiring line 151-2. Accordingly, the (1-2)th pad 181-2 may be electrically connected to four semiconductor elements 100A disposed in the first row on the left side of the region A. This may be equally applied up to the (1-32)th pad 181-32. That is, the (1-n)th pads 181-$n$ (where n is an even number) disposed in the upper line may be electrically connected to the semiconductor elements 100A disposed in the region A.

Meanwhile, this may be similarly applied to the second region 170$b$. That is, the (1-n)th pads 181-$n$ (where n is an odd number) disposed in the upper line may be disposed on the (1-n)th wiring lines 151-$n$ (where n is an odd number) of the odd-numbered lines, respectively. In addition, the (1-n)th pads 181-$n$ (where n is an odd number) may be electrically connected to the semiconductor elements 100A disposed in the region C. The (1-n)th pads 181-$n$ (where n is an even number) disposed in the lower line may be disposed on the (1-n)th wiring lines 151-$n$ (where n is an even number) of the even-numbered lines, respectively. In addition, the (1-n) th pads 181-$n$ (where n is an even number) may be electrically connected to the semiconductor elements 100A disposed in the region D.

The plurality of second pads 182-$n$ ($n \geq 1$) may be disposed along the third and fourth regions 170$c$ and 170$d$ of the peripheral part of the substrate 170. Here, one (2-n)th pad 182-$n$ may be disposed on each of the (2-n)th wiring lines 152-$n$. That is, a total of 16 (2-n)th pads 182-$n$ may be disposed in each of the third and fourth regions 170$c$ and 170$d$. In addition, one (2-n)th pad 182-$n$ may be electrically connected to eight semiconductor elements 100A. However, this is merely one example for describing the present invention and thus the present invention is not limited thereto.

The (2-n)th pads 182-$n$ disposed in the third region 170$c$ may be defined as a (2-1)th pad 182-1, a (2-2)th pad 182-2, . . . , and a (2-16)th pad 182-16 in a sequence from the upper side. Here, the (2-1)th pad 182-1 may be disposed on the (2-1)th wiring line 152-1. Accordingly, the (2-1)th pad 182-1 may be electrically connected to eight semiconductor elements 100A disposed in a first row on an upper portion of the region E. This may be equally applied up to the (2-16)th pad 182-16. In addition, this may be similarly applied to the fourth region 170$d$.

The wavelength conversion layer 190 may be disposed to cover the plurality of semiconductor elements 100A. That is, the wavelength conversion layer 190 and the plurality of semiconductor elements 100A may form a light-emitting part. The wavelength conversion layer 190 may absorb light emitted from the plurality of semiconductor elements 100A, convert the light into light with different wavelength bands, and emit the converted light. For example, the wavelength conversion layer 190 may form white light.

As described above, the plurality of pads 181-$n$ and 182-$n$ may be disposed along the edge part of the substrate 170. Further, the plurality of semiconductor elements 100A may be disposed on an inner side of the plurality of pads 181-$n$ and 182-$n$. That is, the plurality of pads 181-$n$ and 182-$n$ may be disposed to surround the plurality of semiconductor elements 100A. In addition, the plurality of wiring lines 151-$n$ and 152-$n$ may extend to the edge part of the substrate from the first and second conductive semiconductor layers 121 and 122 or the first and second electrodes 141 and 142 and may be connected to the plurality of pads 181-$n$ and 182-$n$. The plurality of semiconductor elements 100A may be formed by growing the first and second conductive semiconductor layers 121 and 122 and the active layer 123 at a time and isolating the first and second conductive semiconductor layers 121 and 122 and the active layer 123 in units of single chip (device) through etching rather than being individually formed. Accordingly, processability may be improved, and simultaneously, a light-emitting region may be increased. Meanwhile, the manufacturing process of the semiconductor device 100 will be described in more detail below.

That is, when individual chips are mounted on a package substrate, which will be described below, in order to be applied to a head lamp for a vehicle, a process may be complicated because each chip should be disposed on a support substrate and a plurality of support substrates should be mounted on each package substrate. In addition, pads and wires for connecting the chip to the support substrate are necessary, and pads and wires for connecting the support substrates to the package substrate are necessary, and thus the area required for mounting the chip may be increased to reduce spatial efficiency.

Further, in order to be seen as a single light source, an interval between the chips should be minimized, but downscaling of the package may be difficult due to the occurrence of a short circuit or the like. In addition, thermal resistance may increase due to an increase in solder amount for bonding the support substrate on which a chip is mounted to the package substrate and an increase in the heat dissipation path of the chip.

However, in the present invention, a plurality of chips may be formed at one time and bonded to one ceramic substrate (support substrate). In addition, only the ceramic substrate may be mounted on the package substrate at one time. Thus, a process may be simplified and process time may be shortened. Also, spatial efficiency may be improved by omitting the support substrate and wire bonding required for the individual chip. In addition, thermal resistance may be minimized by omitting the individual support substrate and solder. In addition, contrast may be improved by adjusting the thickness of a phosphor.

Further, according to the present invention, one wiring line and one pad are connected to a plurality of chips, and the wiring line is disposed between the chips and the substrate so that space may be saved to increase a light-emitting region. Here, the wiring line is formed below a semiconductor structure so that various configurations of the circuit are possible to improve the degree of freedom of design.

FIG. 9C is a conceptual diagram of a semiconductor device package according to the embodiment of the present invention.

Referring to FIG. 9C, a semiconductor device package 200 according to the embodiment of the present invention may include a package substrate 210, a solder 220, pads 231 and 232, wires 241 and 242, and a semiconductor device 100.

The semiconductor device 100 may have the same structure as that described above. The semiconductor device is illustrated in FIG. 9C in the same manner as in FIG. 7 for the convenience of description, but in practice, the semiconductor device 100 may include a plurality of semiconductor elements 100A, a plurality of first pads 181, and a plurality of second pads 182 as illustrated in FIG. 1.

The semiconductor device 100 including the plurality of semiconductor elements may be mounted on the package substrate 210 through the substrate 170 (see FIGS. 1 and 2). That is, the plurality of semiconductor elements may be mounted at one time using one substrate 170, rather than each being disposed on the support substrate and mounted on the package substrate 210. Accordingly, support substrates, pads, wires, and solders for mounting an individual element are omitted so that bonding interfaces and heat dissipation paths may be reduced to minimize thermal resistance.

In particular, wire bonding between an individual element and a support substrate and bonding between the support substrate and a package substrate may be omitted. Accordingly, space required for the mounting may be saved, a light-emitting region may be increased, and processability may be improved.

The semiconductor device 100 may be mounted on the package substrate 210. The package substrate 210 may include a plurality of circuit patterns. Accordingly, driving of the plurality of semiconductor structures 120 of the semiconductor device 100 may be controlled.

The solder 220 may be disposed between the package substrate 210 and the semiconductor device 100. That is, the semiconductor device 100 may be stably disposed on the package substrate 210 by the solder 220.

The pads 231 and 232 may include a first pad 231 and a second pad 232. The first and second pads 231 and 232 may be connected to circuit patterns of the package substrate 210.

The wires 241 and 242 may include a first wire 241 and a second wire 242. The first wire 241 may electrically connect the first pad 231 of the package substrate 210 to a first pad of the semiconductor device 100. The second wire 242 may electrically connect the second pad 232 of the package substrate 210 to a second pad of the semiconductor device 100.

Meanwhile, the first and second pads 231 and 232 and the first and second wires 241 and 242 of the package substrate 210 may each be provided as a plurality similar to the first and second pads of the semiconductor device 100. For example, the first pad (or the second pad) of the semiconductor device 100 may be connected to the plurality of semiconductor structures. In addition, the first pad (or the second pad) of the semiconductor device 100 may be connected to the first pad 231 (or the second pad 232) of the package substrate 210 through the first wire 241 (or the second wire 242).

That is, one pad of the package substrate 210 may be connected to the plurality of semiconductor structures. Thus, space may be saved and a process may be simplified because the pads 231 and 232 are connected to the plurality of semiconductor structures instead of one semiconductor structure.

FIGS. 10A to 10M sequentially illustrate a method of manufacturing the semiconductor device according to the embodiment of the present invention.

Referring to FIG. 10A, an operation of preparing a substrate 110 and forming a semiconductor structure 120 on the substrate 110 may be performed. That is, a first conductive semiconductor layer 121, an active layer 123, and a second conductive semiconductor layer 122 may be sequentially grown on the substrate 110.

The substrate 110 may include a transparent, conductive, or insulating substrate. The substrate 110 may be a material suitable for growing a semiconductor material, or a carrier wafer. The substrate 110 may be made of a material selected from among sapphire (Al2O3), SiC, Si, GaAs, GaN, ZnO, Si, GaP, InP, Ge, and Ga2O3, but the present invention is not limited thereto.

The semiconductor structure 120 may include the first conductive semiconductor layer 121, the second conductive semiconductor layer 122, and the active layer 123 disposed between the first conductive semiconductor layer 121 and the second conductive semiconductor layer 122. The semiconductor structure 120 may be grown by a vapor deposition method, such as metal organic chemical vapor deposition (MOCVD), molecular-beam epitaxy (MBE), hydride vapor phase epitaxy (HVPE), but the present invention is not limited thereto.

Referring to FIG. 10B, an operation of mesa-etching a portion of the semiconductor structure 120 to form a first hole H1 may be performed. The first hole H1 may be formed to have a predetermined depth from the second conductive semiconductor layer 122. The first hole H1 may be formed up to some region of the first conductive semiconductor layer 121. That is, some of the second conductive semiconductor layer 122, the active layer 123, and the first conductive semiconductor layer 121 may be etched.

Referring to FIG. 10C, an operation of forming a protective layer 130 on the semiconductor structure 120 may be performed. In this case, the protective layer 130 may be formed only in a partial region of the semiconductor structure 120. That is, the protective layer 130 may partially expose the first conductive semiconductor layer 121 and the second conductive semiconductor layer 122.

Specifically, the protective layer 130 may partially cover an inner surface of the first hole H1. The protective layer 130 may partially cover the first hole H1 and the second conductive semiconductor layer 122 adjacent to the first hole H1. In this case, the protective layer 130 may partially expose the first conductive semiconductor layer 121 through another hole H in the first hole H1. A first electrode 141 to be described below may be disposed in the first hole H1.

The protective layer 130 may partially expose the second conductive semiconductor layer 122 through a second hole H2. That is, the second hole H2 may be a region of the second conductive semiconductor layer 122 in which the protective layer 130 is not formed. A second electrode 142 to be described below may be disposed in the second hole H2.

Meanwhile, the holes H and H2 may be formed by forming the protective layer 130 on the second conductive semiconductor layer 122 and then etching a partial region of the protective layer 130. Alternatively, the protective layer 130 may be formed only on a partial region of the second conductive semiconductor layer 122 after covering the region in which the holes H and H2 are to be formed with a mask or the like. However, the method of forming the holes H and H2 and the protective layer 130 is not limited thereto.

Referring to FIG. 10D, an operation of disposing the electrodes 141 and 142 in the holes H1 and H2 may be performed. Here, the electrodes 141 and 142 may include the first electrode 141 and the second electrode 142. The first electrode 141 may be disposed in the first hole H1. Specifically, the first electrode 141 may be disposed in another hole H through the protective layer 130 of the first hole H1. The first electrode 141 may be electrically connected to the first conductive semiconductor layer 121. The second electrode 142 may be disposed in the second hole H2. The second electrode 142 may be electrically connected to the second conductive semiconductor layer 122 exposed through the second hole H2.

Meanwhile, although the second electrode 142 is illustrated in the drawing as being provided as two electrodes spaced apart from each other, in practice, the two electrodes may be connected to each other. That is, due to the formation of the hole in the second electrode 142, when viewed in a cross-sectional view, the two second electrodes are illustrated as being spaced apart from each other.

Referring to FIG. 10E, an operation of disposing a second wiring line 152 on the second electrode 142 may be performed. The second wiring line 152 may extend in a direction toward an end part of the substrate 110. Accordingly, an end part of the second wiring line 152 may be easily connected to a pad to be described below.

In particular, the second wiring line 152 may include a second end part 152c extending up to an upper portion of the protective layer 130, which is disposed at the end part of the substrate 110. That is, the second end part 152c may overlap the protective layer 130 in a direction perpendicular to the substrate 110. The second wiring line 152 may be electrically connected to the pad through the second end part 152c.

Referring to FIG. 10F, an operation of disposing a first insulating layer 161 to cover the protective layer 130, the electrodes 141 and 142, and the second wiring line 152 may be performed. The second wiring line 152 may be electrically insulated from a first wiring line 151 to be described below by the first insulating layer 161.

Referring to FIG. 10G, an operation of forming the first wiring line 151 to pass through the first insulating layer 161 and disposing a second insulating layer 162 may be performed. Here, the first wiring line 151 may include a first through part 151a, a first connection part 151b, and a first end part 151c.

The first through part 151a may extend toward one surface of the first insulating layer 161 from the first electrode 141. The first connection part 151b may be bent from the first through part 151a and may extend along one surface of the first insulating layer 161. The first end part 151c may extend in the direction toward the end part of the substrate 110. Accordingly, the first end part 151c of the first wiring line 151 may be easily connected to a pad to be described below.

That is, the first through part 151a may be disposed to pass through the first insulating layer 161, and the first connection part 151b may be disposed on one surface of the first insulating layer 161. Here, a hole may be formed from one surface of the first insulating layer 161 toward the first electrode 141, and the first through part 151a may be disposed in the hole.

Further, the first end part 151c may be disposed to extend up to an upper portion of the protective layer 130, which is disposed at an end part of the substrate 110. That is, the first end part 151c may overlap the protective layer 130 in the direction perpendicular to the substrate 110. The first wiring line 151 may be electrically connected to the pad through the first end part 151c.

The second insulating layer 162 may be disposed to cover the first insulating layer 161 and the first wiring line 151 after the first wiring line 151 is formed. The first wiring line 151 may be insulated and protected by the second insulating layer 162.

Referring to FIG. 10H, an operation of bonding a ceramic substrate 170 on the second insulating layer 162 may be performed. Here, a first bonding layer 171a may be disposed on the ceramic substrate 170, and a second bonding layer 171b may be disposed on the second insulating layer 162. That is, the second insulating layer 162 may be bonded to the ceramic substrate 170 by bonding the first and second bonding layers 171a and 171b.

Referring to FIG. 10I, an operation of separating the substrate 110 from the semiconductor structure 120 may be performed. Here, the substrate 110 may be removed by a laser lift off (LLO) process using an excimer laser beam or the like. Specifically, when light having an energy band gap greater than or equal to that of the substrate is irradiated toward the substrate 110, the substrate 110 may absorb energy and be decomposed. That is, gas molecules of a material included in the substrate 110 may be generated so that the substrate 110 may be separated from the semiconductor structure 120.

Meanwhile, when the substrate 110 is separated, the semiconductor structure 120 may be supported by the ceramic substrate 170. In addition, heat generated in the LLO process may be effectively released due to the ceramic substrate 170.

Referring to FIG. 10J, the circumferences of side parts of the semiconductor structure 120 may be etched. Specifically, an edge part of the semiconductor structure 120 corresponding to an edge part of the substrate 170 may be etched.

At this time, the etching may be performed such that when a material constituting the protective layer 130 is detected using an end-point detection method, the etching is stopped. In addition, the first and second wiring lines 151 and 152 may be disposed below the exposed portion of the protective layer 130. That is, an etching position may be adjusted such that the end parts 151c and 152c of the wiring lines 151 and 152 and the protective layer 130 are disposed below an etched region S.

The protective layer 130 may protect components positioned below the protective layer 130 while etching the semiconductor structure 120 to minimize damage that may occur in a manufacturing process. In addition, first and second pads 181 and 182, which will be described below, may be easily connected to the first and second end parts 151c and 152c, respectively, disposed below the etched region S.

The operation of FIG. 10J may be accomplished by placing the ceramic substrate 170 (hereinafter referred to as the "substrate") at the bottom. That is, the semiconductor device is supported by the substrate 170 so that processes to be described below may be performed smoothly.

Meanwhile, it is illustrated in the drawing that one semiconductor structure 120 is disposed, but in practice, the semiconductor structure 120 may be provided as a plurality (see FIGS. 1 to 9B). That is, in the operation of FIG. 10J, an isolation process may be performed in addition to etching side parts of the semiconductor structure 120. Thus, a relatively large scale of one semiconductor structure 120 may be isolated into a plurality of semiconductor structures in a chip unit. In this case, the plurality of semiconductor structures may be disposed to be spaced apart from each other by a predetermined interval. In addition, only one of each of the first and second wiring lines 151 and 152 electrically connected to the first and second conductive semiconductor layers 121 and 122, respectively, is illustrated in the drawing, but in practice, each of the first and second wiring lines 151 and 152 may be provided as a plurality. In addition, each of the first and second wiring lines 151 and 152 may also be electrically connected to the plurality of semiconductor structures 120. That is, in FIGS. 10E and 10G, it is illustrated that each of the first and second wiring lines 151 and 152 is formed as one, but in practice, each of the first and second wiring lines 151 and 152 may be provided as a plurality connected to the plurality of semiconductor structures in a chip unit.

Referring to FIG. 10K, an operation of forming an irregular structure T on the semiconductor structure 120 may be performed. Specifically, the irregular structure T may be formed on the first conductive semiconductor layer 121. The light extraction efficiency of a semiconductor device 100 may be improved due to the irregular structure T.

Referring to FIG. 10L, an operation of disposing a third insulating layer 163 on the semiconductor structure 120 and the exposed portion of the protective layer 130 and forming holes H3-1 and H3-2 to partially expose the end parts 151c and 152c of the wiring lines 151 and 152 may be performed. At this time, the holes H3-1 and H3-2 may be formed by being etched from the etched region S.

That is, the semiconductor structure 120 may be insulated and protected through the third insulating layer 163. Here, the third insulating layer 163 may also include an irregular structure due to the irregular structure of the semiconductor structure 120.

In addition, a (3-1)th hole H3-1 may be formed to expose the first end part 151c, and a (3-2)th hole H3-2 may be formed to expose the second end part 152c. That is, the (3-1)th hole H3-1 may be formed by etching the protective layer 130 and the first insulating layer 161 from the third insulating layer 163. The (3-2)th hole H3-2 may be formed by etching the protective layer 130 from the third insulating layer 163.

Referring to FIG. 10M, an operation of disposing the pads 181 and 182 in regions in which the semiconductor structure 120 is etched may be performed. Here, each of the pads 181 and 182 may include a first region 181a or 182a and a second region 181b or 182b.

Specifically, the first regions 181a and 182a may be disposed in the (3-1)th and (3-2)th holes H3-1 and H3-2, respectively. That is, the second regions 181b and 182b may be disposed to protrude from the first regions 181a and 182a disposed in the (3-1)th and (3-2)th holes H3-1 and H3-up to the region in which the semiconductor structure 120 is etched.

The first region 181a of the first pad 181 may be electrically connected to the first end part 151c of the first wiring line 151. The first region 181a may pass through the first insulating layer 161, the protective layer 130, and the third insulating layer 163. The second region 181b of the first pad 181 may protrude outward from the third insulating layer 163 and may be disposed at the side part of the semiconductor structure 120.

The first region 182a of the second pad 182 may be electrically connected to the second end part 152c of the second wiring line 152. The first region 182a may pass through the protective layer 130 and the third insulating layer 163. The second region 182b of the second pad 182 may protrude outward from the third insulating layer 163 and may be disposed at the side part of the semiconductor structure 120.

Meanwhile, in the drawing, one of each of the first and second pads 181 and 182 is disposed, but in practice, each of the first and second pads 181 and 182 may be provided as a plurality similar to the semiconductor structure 120 and the wiring lines 151 and 152 (see FIG. 1). In addition, a wavelength conversion layer may be further formed on the semiconductor structure.

In this manner, in the present invention, a large scale of semiconductor structure may be formed, and may be isolated on the substrate 170 and separated into the semiconductor unit 120 in a chip unit. In addition, a peripheral part of the semiconductor structure corresponding to a peripheral part of the substrate 170 may be etched together, and the pads 181 and 182 may be disposed in the regions in which the semiconductor structure is etched. Here, the wiring lines 151 and 152 electrically connected to the semiconductor structure 120 may be disposed to extend up to lower portions of the etched regions. Thus, the pads 181 and 182 may be easily connected to the wiring lines.

That is, the plurality of semiconductor structures 120 may be disposed on one substrate 170, and the plurality of pads 181 and 182 may be disposed along the peripheral part of the substrate 170. Here, one of each of the pads 181 and 182 may be electrically connected to the plurality of semiconductor structures 120. In addition, the wiring lines 151 and 152 may be formed between the semiconductor structure 120 and the substrate 170.

Accordingly, wire bonding for connecting individual chips (semiconductor elements) to substrates and a package substrate may be omitted so that the package may be miniaturized. Also, processability may be improved by shortening a process. In addition, a semiconductor region may be further increased by saving unnecessary space.

The semiconductor device may be used as a light source of a lighting system, a light source of an image display device, or a light source of a lighting device. That is, the semiconductor device may be disposed in a case and applied to various electronic devices that provide light. As an example, when the semiconductor device is mixed with a red-green-blue (RGB) phosphor and used, white light with a high color rendering index (CRI) may be implemented.

The above-described semiconductor device may be configured as a light-emitting device package and used as a light source of a lighting system. For example, the semiconductor device may be used as a light source of an image display device or a light source of a lighting device.

When the semiconductor device is used as a backlight unit of an image display device, the semiconductor device may be used as an edge-type backlight unit or a direct-type backlight unit, and when the semiconductor device is used as a light source of a lighting device, the semiconductor device may be used as a lighting apparatus or a bulb-type lighting device. Alternatively, the semiconductor device may be used as a light source of a mobile terminal or a head lamp for a vehicle.

A light-emitting device includes a laser diode in addition to a light-emitting diode.

Like the light-emitting device, the laser diode may include a first conductive semiconductor layer, an active layer, and a second conductive semiconductor layer that have the above-described structures. In addition, the laser diode uses an electro-luminescence phenomenon in which light is emitted when a current flows after the bonding of a p-type first conductive semiconductor and an n-type second conductive semiconductor, but the laser diode has differences in terms of the direction and phase of emitted light. That is, the laser diode may emit light having one specific wavelength (monochromatic beam) to have the same phase in the same direction using the stimulated emission phenomenon and the constructive interference phenomenon. Due to the above characteristics, the laser diode is available to optical communication, medical equipment, and semiconductor processing equipment.

While the present invention has been mainly described with reference to the embodiment, it should be understood that the present invention is for illustrative purposes only and not limited to the disclosed embodiment, and various modifications and applications can be devised by those skilled in the art to which the present invention pertains without departing from the gist of the present invention. For example, the components described in the embodiments may be implemented while being modified. In addition, it should be noted that differences related to the modifications and applications are included within the scope of the present invention defined by the appended claims.

The invention claimed is:

1. A semiconductor device comprising:
a substrate;
a plurality of semiconductor structures disposed at a center portion of the substrate;
a first pad and a second pad disposed on edge parts of the substrate;
a first wiring line electrically connecting the first pad to at least one of the plurality of semiconductor structures;
a second wiring line electrically connecting the second pad to at least one of the plurality of semiconductor structures;
a first insulating layer disposed between the first wiring line and the second wiring line; and
a wavelength conversion layer disposed on the plurality of semiconductor structures,
wherein the plurality of semiconductor structures are disposed to be spaced apart from each other in a first direction and a second direction,
the first direction and the second direction cross each other,
a separation distance between the plurality of semiconductor structures is in a range of 5 µm to 40 µm, and
a thickness of the wavelength conversion layer is in a range of 1 µm to 50 µm,
wherein each of the plurality of semiconductor structures includes a first conductive semiconductor layer, a second conductive semiconductor layer, and an active layer disposed between the first conductive semiconductor layer and the second conductive semiconductor layer,
wherein the first wiring line includes:
a first through part electrically connected to a first electrode of a respective semiconductor structure through the active layer, the second conductive semiconductor layer, and the first insulating layer;
a first end part extending toward a first edge part of the substrate further than a first line extending from a first outer surface of the respective semiconductor structure; and
a first connecting part connecting the first through part to the first end part, wherein the second wiring line includes:
a connection part disposed on a second electrode of the respective semiconductor structure; and
a second end part extending toward a second edge part of the substrate further than a second line extending from a second outer surface opposite to the first outer surface of the respective semiconductor structure,
wherein the first pad includes a first region electrically connected to the first end part of the first wiring through the first insulating layer, and a second region protruding from the first edge part of the substrate by extending from the first region,
wherein the second pad includes a first region electrically connected to the second end part of the second wiring, and a second region protruding from the second edge part of the substrate by extending from the first region, and
wherein the first connecting part of the first wiring line directly contacts a lower surface of the first insulating layer and the connection part of the second wiring line is disposed in an upper surface of the first insulating layer such that the first region of the first pad protrudes further through the first insulating layer than the first region of the second pad protrudes through the first insulating layer, and
wherein the first wiring line, a protective layer, and the first pad overlap each other in a direction perpendicular to the substrate at the first edge part of the substrate.

2. The semiconductor device of claim 1, wherein the thickness of the wavelength conversion layer is greater than a thickness of the semiconductor structure.

3. The semiconductor device of claim 1, wherein in the plurality of semiconductor structures, a ratio of a width of the semiconductor structure in the first direction to the separation distance between the plurality of semiconductor structures is 1:8 to 6:1.

4. The semiconductor device of claim 1, wherein
the thickness of the wavelength conversion layer is in a range of 10 µm to 30 µm, and
an average diameter (D50) of wavelength conversion particles is in a range of 1 µm to 20 µm.

5. The semiconductor device of claim 1, wherein
the semiconductor structure further includes a plurality of holes having a predetermined depth from the second conductive semiconductor layer toward the first conductive semiconductor layer, and
the plurality of holes are disposed to face the substrate.

6. The semiconductor device of claim 5, wherein the protective layer is disposed to partially expose the first conductive semiconductor layer and the second conductive semiconductor layer between the substrate and the semiconductor structure,
wherein the first region of the first pad is electrically connected to the second end part of the second wiring through the protective layer.

7. The semiconductor device of claim 6, wherein the first electrode and the second electrode are disposed on the first conductive semiconductor layer and the second conductive semiconductor layer, respectively, exposed due to the protective layer.

8. The semiconductor device of claim 7, wherein the first electrode is disposed in at least one of the plurality of holes.

9. The semiconductor device of claim 8, wherein the first wiring line and the second wiring line are disposed to extend from the first electrode and the second electrode, respectively.

10. The semiconductor device of claim 7, wherein the first electrode is disposed on the first conductive semiconductor layer which is exposed due to the protective layer.

11. The semiconductor device of claim 7, wherein the second electrode is disposed on the second conductive semiconductor layer which is exposed due to the protective layer.

12. The semiconductor device of claim 6, wherein
the first pad, the protective layer, and the first end part overlap each other in the direction perpendicular to the substrate at the first edge part of the substrate, and
the second pad, the protective layer, and the second end part overlap each other in the direction perpendicular to the substrate at the second edge part of the substrate.

13. The semiconductor device of claim 1, wherein the plurality of first pads and the plurality of second pads are disposed along the edge part of the substrate.

14. The semiconductor device of claim 13, wherein the plurality of semiconductor devices are disposed in a center of the plurality of first pads and the plurality of second pads.

15. The semiconductor device of claim 1, wherein the first pad and the second pad are disposed above the substrate to surround the semiconductor structure at side portions of the semiconductor structure.

16. A head lamp comprising:
a circuit board including a plurality of electrode patterns;
a semiconductor device disposed on the circuit board; and
a lens covering the semiconductor device,
wherein the semiconductor device includes a substrate, a plurality of semiconductor structures disposed at a center portion of the substrate, a plurality of first pads and a plurality of second pads disposed on edge parts of the substrate, a first wiring line electrically connecting the first pad to at least one of the plurality of semiconductor structures, a second wiring line electrically connecting the second pad to at least one of the plurality of semiconductor structures, a wavelength conversion layer disposed on the plurality of semiconductor structures, and a first insulating layer disposed between the first wiring line and the second wiring line,
wherein the plurality of semiconductor structures are disposed to be spaced apart from each other in a first direction and a second direction, the first direction and the second direction cross each other, a separation distance between the plurality of semiconductor structures is in a range of 5 µm to 40 µm, and the wavelength conversion layer has a thickness of 1 µm or more and 50 µm or less,
wherein the plurality of electrode patterns are electrically connected to the plurality of first pads and the plurality of second pads through wires,
wherein each of the plurality of semiconductor structures includes a first conductive semiconductor layer, a second conductive semiconductor layer, and an active layer disposed between the first conductive semiconductor layer and the second conductive semiconductor layer,
wherein the first wiring line includes:
a first through part electrically connected to a first electrode of a respective semiconductor structure through the active layer, the second conductive semiconductor layer, and the first insulating layer;
a first end part extending toward a first edge part of the substrate further than a first line extending from a first outer surface of the respective semiconductor structure; and
a first connecting part connecting the first through part to the first end part,
wherein the second wiring line includes:
a connection part disposed on a second electrode of the respective semiconductor structure; and
a second end part extending toward a second edge part of the substrate further than a second line extending from a second outer surface opposite to the first outer surface of the respective semiconductor structure,
wherein the first pad includes a first region electrically connected to the first end part of the first wiring through the first insulating layer, and a second region protruding from the first edge part of the substrate by extending from the first region,
wherein the second pad includes a first region electrically connected to the second end part of the second wiring, and a second region protruding from the second edge part of the substrate by extending from the first region,
wherein the first connecting part of the first wiring line directly contacts a lower surface of the first insulating layer and the connection part of the second wiring line is disposed in an upper surface of the first insulating layer such that the first region of the first pad protrudes further through the first insulating layer than the first region of the second pad protrudes through the first insulating layer, and
wherein the first wiring line, a protective layer, and the first pad overlap each other in a vertical direction at an edge part of the substrate.

* * * * *